United States Patent
Arasawa et al.

(10) Patent No.: US 9,105,256 B2
(45) Date of Patent: *Aug. 11, 2015

(54) LIQUID CRYSTAL DISPLAY DEVICE AND DRIVING METHOD THEREOF

(71) Applicant: Semiconductor Energy Laboratory Co., Ltd., Atsugi-shi, Kanagawa-ken (JP)

(72) Inventors: Ryo Arasawa, Isehara (JP); Kouhei Toyotaka, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/244,218

(22) Filed: Apr. 3, 2014

(65) Prior Publication Data

US 2014/0210808 A1  Jul. 31, 2014

Related U.S. Application Data

(63) Continuation of application No. 12/968,334, filed on Dec. 15, 2010, now Pat. No. 8,698,717.

(30) Foreign Application Priority Data

Dec. 18, 2009 (JP) .................................. 2009-288283

(51) Int. Cl.
*G09G 3/36* (2006.01)
*H01L 27/12* (2006.01)

(52) U.S. Cl.
CPC ............ *G09G 3/3696* (2013.01); *G09G 3/3614* (2013.01); *G09G 2320/0247* (2013.01);
(Continued)

(58) Field of Classification Search
CPC .......... G09G 3/3648; G09G 2330/021; G09G 3/3614; G09G 3/3688; G09G 3/3677; G09G 2300/0823; G09G 2310/06; G09G 2320/0219; G09G 2310/0254; G09G 2340/16; G09G 3/3696; H01L 27/1225; H01L 29/7869; H01L 27/3262
USPC ..................... 345/87–100, 204–212; 257/43
See application file for complete search history.

(56) References Cited

U.S. PATENT DOCUMENTS 5,473,451 A   12/1995   Kazurov et al.
5,534,884 A    7/1996   Mase et al.
(Continued)

FOREIGN PATENT DOCUMENTS

CN    001348159 A   5/2002
EP     1195741 A    4/2002
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Hong Zhou
(74) *Attorney, Agent, or Firm* — Eric J. Robinson; Robinson Intellectual Property Law Office, P.C.

(57) ABSTRACT

Disclosed is a liquid crystal display device and a driving method thereof for displaying an image, in which the polarity of a voltage applied to the liquid crystal element is inverted in a first frame period and a second frame period which are sequential. The voltage applied to the liquid crystal element is compensated in the case where images of the first frame period and the second frame period are judged as a still image as a result of comparison of the image of the first frame period with the image of the second frame period and the absolute value of the voltage applied to the liquid crystal element in the first frame period is different from that of the voltage applied to the liquid crystal element in the second frame period.

15 Claims, 12 Drawing Sheets

(52) U.S. Cl.
CPC .... *G09G2320/103* (2013.01); *G09G 2330/021* (2013.01); *G09G 2340/16* (2013.01); *H01L 27/1225* (2013.01)

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 5,767,832 A | 6/1998 | Koyama et al. |
| 6,169,532 B1 | 1/2001 | Sumi et al. |
| 6,294,274 B1 | 9/2001 | Kawazoe et al. |
| 6,317,109 B1 | 11/2001 | Lee |
| 6,563,174 B2 | 5/2003 | Kawasaki et al. |
| 6,727,522 B1 | 4/2004 | Kawasaki et al. |
| 6,795,066 B2 | 9/2004 | Tanaka et al. |
| 7,002,541 B2 | 2/2006 | Yanagi et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,477,223 B2 | 1/2009 | Sekiguchi et al. |
| 7,501,293 B2 | 3/2009 | Ito et al. |
| 7,601,984 B2 | 10/2009 | Sano et al. |
| 7,623,125 B2 | 11/2009 | Harada |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,855,706 B2 | 12/2010 | Ozawa |
| 8,164,256 B2 | 4/2012 | Sano et al. |
| 8,188,480 B2 | 5/2012 | Itai |
| 8,243,055 B2 | 8/2012 | Abe |
| 8,432,502 B2 | 4/2013 | Yamazaki et al. |
| 8,541,944 B2 | 9/2013 | Sano et al. |
| 8,704,217 B2 | 4/2014 | Yano et al. |
| 2001/0046027 A1 | 11/2001 | Tai et al. |
| 2002/0056838 A1 | 5/2002 | Ogawa |
| 2002/0075205 A1 | 6/2002 | Kimura et al. |
| 2002/0093473 A1 | 7/2002 | Tanaka et al. |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0113879 A1 | 6/2004 | Sekiguchi et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0231497 A1 | 10/2005 | Harada |
| 2005/0253829 A1 | 11/2005 | Mamba et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0273682 A1 | 11/2007 | Yi et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284710 A1 | 11/2008 | Kimura et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0049511 A1 | 3/2011 | Yano et al. |
| 2011/0090183 A1 | 4/2011 | Yamazaki et al. |
| 2011/0090204 A1 | 4/2011 | Yamazaki et al. |
| 2011/0090207 A1 | 4/2011 | Yamazaki et al. |
| 2011/0102696 A1 | 5/2011 | Yamazaki et al. |
| 2011/0115839 A1 | 5/2011 | Takahashi et al. |

FOREIGN PATENT DOCUMENTS

| | | |
|---|---|---|
| EP | 1737044 A | 12/2006 |
| EP | 2105967 | 9/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-217894 | 8/1990 |
| JP | 05-224626 | 9/1993 |
| JP | 05-251705 A | 9/1993 |
| JP | 07-005851 A | 1/1995 |
| JP | 08-264794 A | 10/1996 |

(56) References Cited

FOREIGN PATENT DOCUMENTS

| | | |
|---|---|---|
| JP | 11-101967 A | 4/1999 |
| JP | 11-505377 | 5/1999 |
| JP | 2000-044236 A | 2/2000 |
| JP | 2000-150900 A | 5/2000 |
| JP | 2000-267066 A | 9/2000 |
| JP | 2001-312253 | 11/2001 |
| JP | 2002-076356 A | 3/2002 |
| JP | 2002-207462 A | 7/2002 |
| JP | 2002-278523 | 9/2002 |
| JP | 2002-289859 A | 10/2002 |
| JP | 2003-086000 A | 3/2003 |
| JP | 2003-086808 A | 3/2003 |
| JP | 2003-131633 | 5/2003 |
| JP | 2004-103957 A | 4/2004 |
| JP | 2004-205896 | 7/2004 |
| JP | 2004-206075 | 7/2004 |
| JP | 2004-273614 A | 9/2004 |
| JP | 2004-273732 A | 9/2004 |
| JP | 2005-300948 A | 10/2005 |
| JP | 2006-165527 | 6/2006 |
| JP | 2008-065308 | 3/2008 |
| JP | 2008-141119 A | 6/2008 |
| JP | 2008-176287 A | 7/2008 |
| JP | 2009-004757 | 1/2009 |
| JP | 2009-231613 | 10/2009 |
| TW | 558707 | 10/2003 |
| TW | 200941727 | 10/2009 |
| WO | WO-2004/059603 | 7/2004 |
| WO | WO-2004/114391 | 12/2004 |
| WO | WO-2008/069288 | 6/2008 |
| WO | WO-2008/075697 | 6/2008 |
| WO | WO-2009/091013 | 7/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by ArPlasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT, ", SID Digest '09 : SID International Symposium Digest of Technical Papers, May, 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In, Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZo ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May, 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Tsuda, K. et al., "Ultra Low Power Consumption Technologies for Mobile TFT-LCDs," IDW '02: Proceedings of the 9th International Display Workshops, 2002, pp. 295-298.

International Search Report (Application No. PCT/JP2010/070755) dated Dec. 21, 2010.

Written Opinion (Application No. PCT/JP2010/070755) dated Dec. 21, 2010.

McGraw-Hill Dictionary of Scientific and Technical Terms, Fifth Edition.

The IEEE Standard Dictionary of Electrical and Electronics Terms, Sixth Edition.

Chinese Office Action (Application No. 201080053869.2) Dated Jul. 29, 2014.

Chinese Office Action (Application No. 201080053869.2) Dated Apr. 17, 2015.

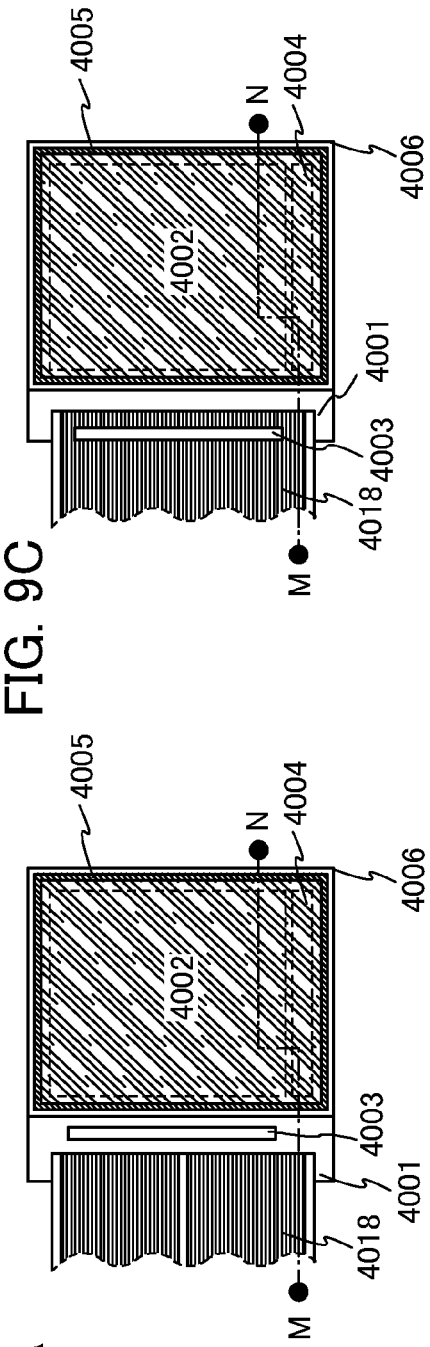
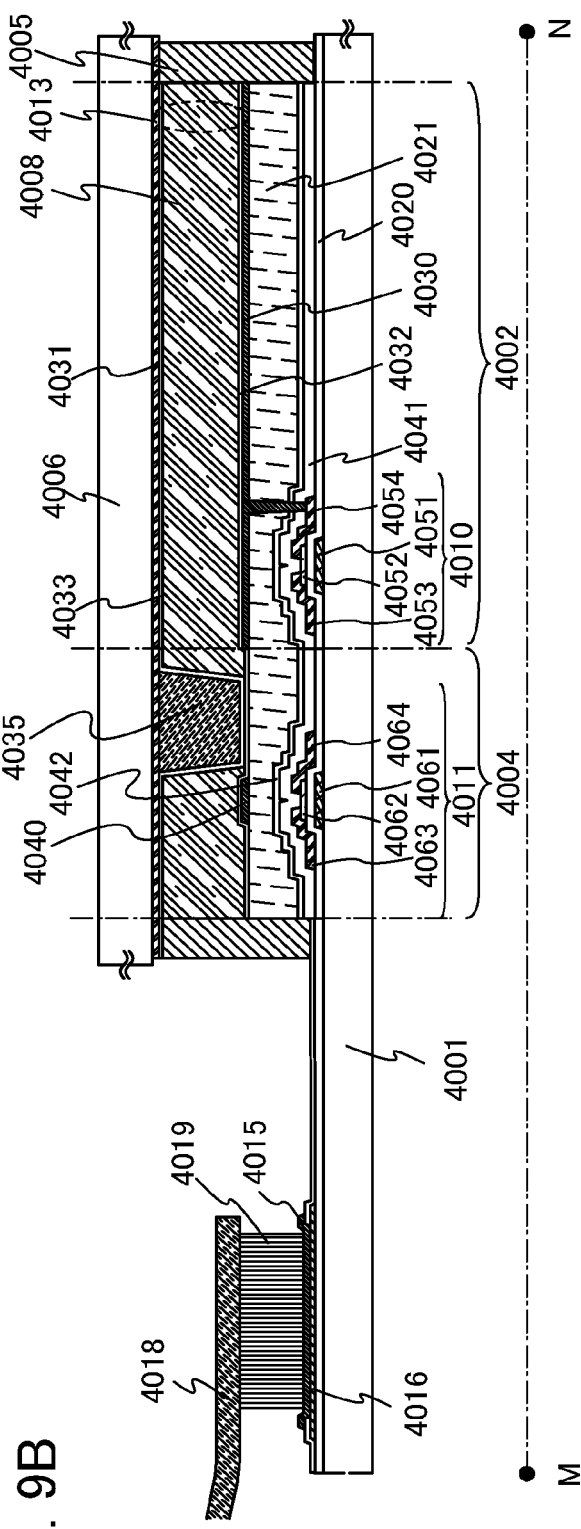

LIQUID CRYSTAL DISPLAY DEVICE AND DRIVING METHOD THEREOF

TECHNICAL FIELD

The present invention relates to a liquid crystal display device and a method for driving the liquid crystal display device.

BACKGROUND ART

Liquid crystal display devices have been applied in a wide range of fields from large display devices such as TV sets to small display devices such as mobile phones, and those with higher added value have been developed. In recent years, in view of rising interest in the global environment and improvement of the convenience of mobile devices, development of liquid crystal display devices with low power consumption has attracted attention.

For example, Patent Document 1 discloses a technique for reducing the power consumption of a liquid crystal display device, according to which all of the signal lines are electrically disconnected to a signal line driver circuit to have high impedance in order to keep the voltage of each signal line constant in a break period during which no scan line and no signal line are selected.

Non-Patent Document 1 discloses a structure for reducing the power consumption of a liquid crystal display device, according to which the refresh rate is made to be different in the case of moving image display and in the case of still image display. Non-Patent Document 1 further discloses a technique for preventing fluctuation of a voltage applied to a liquid crystal element in order to prevent a flicker due to the fluctuation of the voltage applied to the liquid crystal element, which is accompanied by switching of a signal between a break period and a scan period in the case where a still image is displayed, according to which AC signals with the same phase are applied to a signal line and a common electrode also in the break period.

REFERENCE

Patent Document 1: Japanese Published Patent Application No. 2001-312253
Non-Patent Document 1: Kazuhiko Tsuda et al., IDW'02, pp 295-298

DISCLOSURE OF INVENTION

However, in the above-referenced driving methods, a configuration of a driver circuit which supplies a signal to a scan line or a signal line of the liquid crystal display device and an operation thereof are complicated, so that power consumption of the liquid crystal display device cannot be reduced enough.

Further, in the case where the break period during which no scan line and no signal line are selected is provided as described in Patent Document 1, the interval between writing operations into pixels becomes long, by which the voltage applied to a liquid crystal element is largely decreased by leakage current of a transistor or parasitic capacitance in some cases. Large decrease in the voltage applied to the liquid crystal element lowers display quality; for example, display with a predetermined gray scale level cannot be performed.

For example, in liquid crystal display devices, in order to suppress occurrence of image burn-in, a driving method in which the levels (polarities) of the voltages applied to a pair of electrodes of a liquid crystal element are inverted per frame period (the driving method also referred to as inversion driving) has been used.

In the case where the inversion driving is performed, decrease of the voltage applied to the liquid crystal element due to the leakage current of the transistor causes a difference of the gray scale level of images displayed in respective two sequential frame periods even when image signals for the same image are input to the two sequential frame periods.

In view of the above, an object of one embodiment of the present invention is to provide a liquid crystal display device which does not need a complicated operation in a driver circuit of the liquid crystal display device and consumes less power consumption in the case where a still image is displayed. Further, an object of one embodiment of the present invention is to suppress deterioration of the display quality.

One embodiment of the present invention is a liquid crystal display device in which a transistor including an oxide semiconductor layer functioning as a channel formation layer is provided in a pixel, in which a voltage applied to a liquid crystal element is compensated in displaying a still image so that fluctuation of the gray scale level of a still image between subsequent frame periods is suppressed.

One embodiment of the present invention is a driving method of a liquid crystal display device including a pixel and a driver circuit for controlling whether or not an image signal is supplied to the pixel. The pixel includes a liquid crystal element including a first terminal to which the image signal is supplied and a second terminal to which a common voltage is input, and a transistor for controlling whether or not the image signal is supplied to the first terminal of the liquid crystal element. The transistor includes an oxide semiconductor layer functioning as a channel formation layer. A polarity of a voltage which is applied to the liquid crystal element is inverted between a first frame period and a second frame period which are sequential frame periods, so that image display is performed. According to the driving method, the voltage applied to the liquid crystal element is compensated in the case where an image formed by the images in the first frame period and the second frame period are judged as a still image as a result of comparison of the image in the first frame period with the image in the second frame period and the absolute value of the voltage applied to the liquid crystal element in the first frame period is different from that of the voltage applied to the liquid crystal element in the second frame period.

One embodiment of the present invention is a driving method of a liquid crystal display device including a pixel and a driver circuit for controlling whether or not an image signal is supplied to the pixel. The pixel includes a liquid crystal element including a first terminal to which the image signal is supplied and a second terminal to which a common voltage is input and a transistor for controlling whether or not the image signal is supplied to the first terminal of the liquid crystal element. The transistor includes an oxide semiconductor layer functioning as a channel formation layer and having a carrier concentration of less than $1\times10^{14}/cm^3$. A polarity of the voltage which is applied to the liquid crystal element is inverted between a first frame period and a second frame period which are sequential frame periods, so that image display is performed. According to the driving method, the voltage applied to the liquid crystal element is compensated in the case where an image formed by the images of the first frame period and the second frame period are judged as a still image as a result of comparison of the image of the first frame period with the image of the second frame period and the absolute value of the voltage applied to the liquid crystal element in the first frame period is different from that of the voltage applied to the liquid crystal element in the second frame period.

According to one embodiment of the present invention, power consumption in the case where a still image is displayed on a liquid crystal display device can be reduced. Further, according to one embodiment of the present invention, deterioration of the display quality can be suppressed.

BRIEF DESCRIPTION OF DRAWINGS

In the accompanying drawings:

FIGS. 9A to 9C illustrate examples of a liquid crystal display device in Embodiment 4;

BEST MODE FOR CARRYING OUT THE INVENTION

Figure 1:
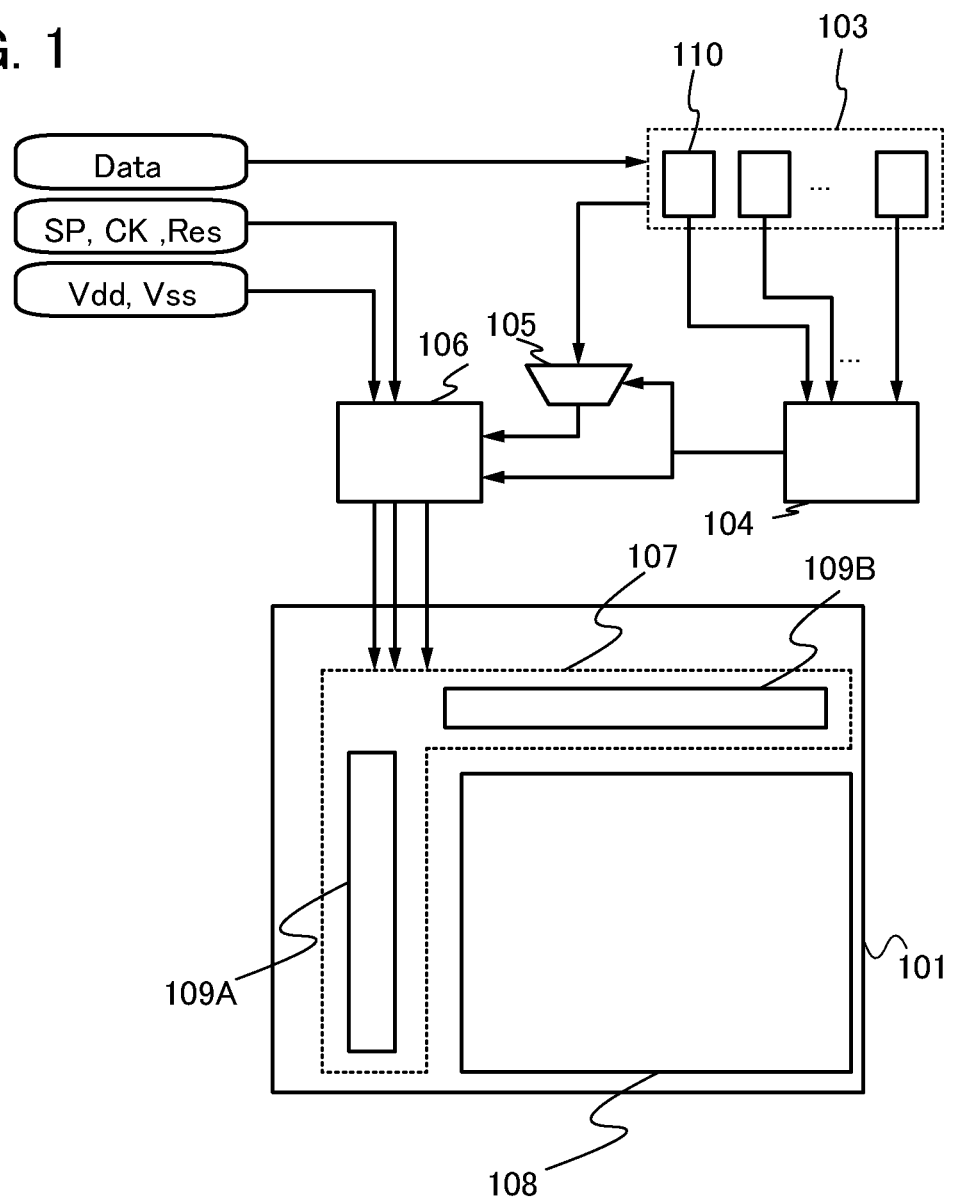
FIG. 1 illustrates a structure example of a liquid crystal display device in Embodiment 1.

Embodiments of the present invention and examples thereof will be hereinafter described with reference to the accompanying drawings. The present invention can be carried out in many different modes, and it is easily understood by those skilled in the art that modes and details of the present invention can be modified in various ways without departing from the purpose and the scope of the present invention. Accordingly, the present invention is not construed as being limited to the described content of the embodiments and examples included herein. Note that identical portions or portions having the same function are denoted by the same reference numerals throughout the drawings in the structures of the present invention described below.

The size, the layer thickness, or the area of each structure is exaggerated in the drawings of the embodiments for clarification in some cases; therefore, the embodiments of the present invention are not limited to such scales.

Numerals such as an "N-th" (N is a natural number) are used for avoiding confusion of components in this specification and do not imply the number of the components.

(Embodiment 1)

In Embodiment 1, a driving method of a liquid crystal display device according to one embodiment of the present invention and the liquid crystal display device will be described.

First, a structure of the liquid crystal display device in this embodiment is described with reference to FIG. 1. FIG. 1 is a block diagram illustrating an example of the structure of the liquid crystal display device in this embodiment.

A liquid crystal display device shown in FIG. 1 includes a display panel 101, a memory circuit 103, a comparison circuit 104, a selection circuit 105, and a display control circuit 106.

The display panel 101 includes a driver circuit portion 107 and a pixel portion 108.

The driver circuit portion 107 includes a driver circuit 109A and a driver circuit 109B. The pixel portion 108 includes a plurality of pixels. The driver circuits 109A and 109B are driver circuits for driving the plurality of pixels in the pixel portion 108. The driver circuit 109A functions as a scan line driver circuit for controlling a scan line for selecting a pixel into which image data is written. The driver circuit 109B is a driver circuit which controls whether or not an image signal is supplied to a pixel and functions as a signal line driver circuit for controlling a signal line to which an image signal including image data is supplied. In the liquid crystal display device of this embodiment, the driver circuits 109A and 109B can include transistors.

The memory circuit 103 is a circuit into which an image signal (also referred to as a signal Data) is input and which holds data of the image signal (also referred to as image data) for a certain period. The memory circuit 103 includes a frame memory 110. The frame memory 110 stores data of image signals of a plurality of frames. The number of the frame memories 110 included in the memory circuit 103 is not particularly limited; as shown in FIG. 1, the memory circuit 103 may include a plurality of the frame memories 110. In the liquid crystal display device of this embodiment, the frame memory 110 may include a memory element such as a dynamic random access memory (DRAM) or a static random access memory (SRAM).

The comparison circuit 104 is a circuit which selectively reads out data of image signals in subsequent frame periods stored in the memory circuit 103, compares the data of the image signals, and detects a difference thereof. For example, data of the image signals of first to n-th frame periods are stored (n is a natural number larger than 1), and the comparison circuit 104 compares data of an image signal of an m-th frame period with data of an image signal of an (m+1)-th frame period (m is a natural number smaller than n). In the comparison circuit 104, the difference is detected, whereby whether the data of the image signals in the subsequent frame periods are data of image signals for displaying a moving image or data of image signals for displaying a still image is judged. In the liquid crystal display device of this embodiment, the detection criterion of a difference may be set such that the difference can be recognized when the difference detected by the comparison circuit 104 exceeds a certain value.

In this specification, the term "moving image" means an image which is recognized as being changed in sequential frame periods when a plurality of images temporally divided into the images in a plurality of frames are switched for operation. The term "still image" means an image which is recognized as not being changed in sequential frame periods when a plurality of images temporally divided into the images in a plurality of frames are switched for operation.

The selection circuit 105 is a circuit which selects, when data of image signals compared in the comparison circuit 104 is judged as data of image signals for displaying a moving image (i.e., when the data of the image signal of the m-th frame period is judged as being different from the data of the image signal of the (m+1)-th frame period), the data of the image signals from the frame memory (memories) 110 and outputs the data of the image signals as image signals to the display control circuit 106. The selection circuit 105 includes a circuit including a plurality of switches such as transistors. In the case where no difference of data of image signals between sequential frame periods is detected in the comparison circuit 104 (i.e., the data of the image signal of the m-th frame period is judged as being the same as the data of the image signal of the (m+1)-th frame period), images displayed in the frame periods are a still image. In that case, the data of the image signal of the latter frame period is not output as an image signal to the display control circuit 106 in this embodiment.

The display control circuit 106 is a circuit to which an image signal, a start signal (also referred to as a start pulse or a signal SP), a clock signal (also referred to as a signal CK), a reset signal (also referred to as a signal Res), a high power source voltage (also referred to as a voltage Vdd), and a low power source voltage (also referred to as a voltage Vss) are supplied and which controls whether or not one or more of the signals and voltages is supplied to the driver circuit portion 107. For example, in the case where images in sequential frame periods are judged as a moving image by the comparison of the comparison circuit 104, image signals are supplied from the selection circuit 105 to the display control circuit 106, and the start signal SP, the clock signal CK, the reset signal Res, the high power source voltage Vdd, and the low power source voltage Vss are supplied to the driver circuit portion 107. On the other hand, in the case where an image formed by images of sequential frame periods is judged as a still mage by the comparison of the comparison circuit 104, an image signal of the latter frame period is not supplied from the selection circuit 105 and one or more of the start signal SP, the clock signal CK, the reset signal Res, the high power source voltage Vdd, and the low power source voltage Vss is not supplied to the driver circuit portion 107, in some cases.

Note that the term "voltage" generally means a difference between potentials at two points (also referred to as a potential difference). However, values of both a voltage and a potential are represented using volt (V) in a circuit diagram or the like in some cases, so that it is difficult to discriminate between them. Thus, in this specification, a potential difference between a potential at one point and a reference potential is sometimes used as a voltage at the point unless otherwise specified.

Further, a transmissive type liquid crystal display device, a semi-transmissive type liquid crystal display device, or a reflective type liquid crystal display device can be employed as the liquid crystal display device of this embodiment.

A progressive type display, an interlace type display, or the like can be employed as the display type of the liquid crystal display device of this embodiment. Further, color elements controlled in a pixel at the time of color display are not limited to three colors: R, G, and B (R, G, and B correspond to red, greed, and blue, respectively). For example, R, G, B, and W (W corresponds to white); R, G, B, and one or more of yellow, cyan, magenta, and the like; or the like can be used. Further, the size of the display region may be different depending on a dot of a color element. The liquid crystal display device of this embodiment is not limited to a display device for color display; this embodiment can also be applied to a display device for monochrome display.

Figure 2:
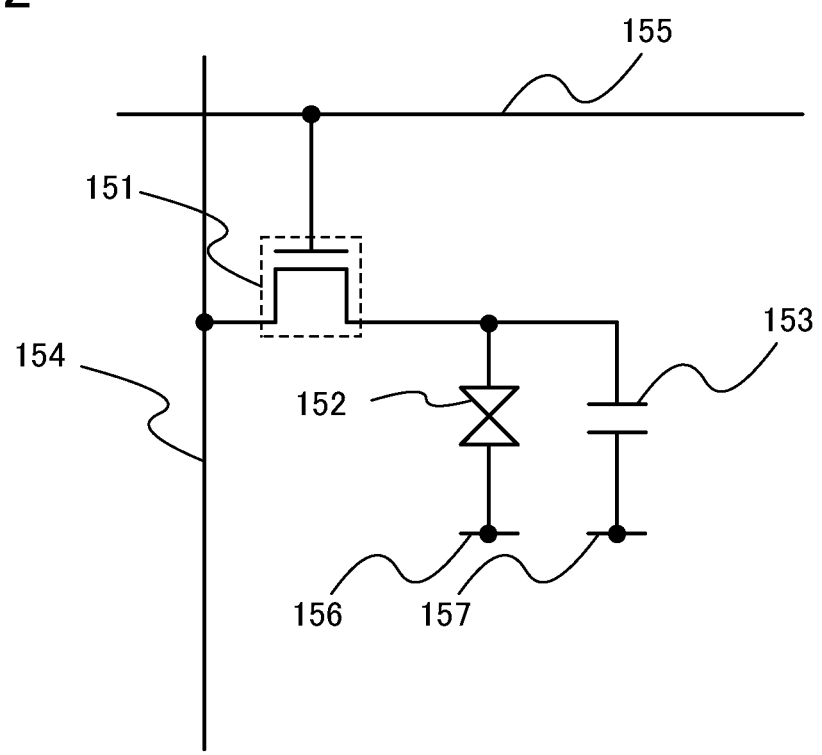
FIG. 2 illustrates an example of a pixel structure of a liquid crystal display device in Embodiment 1.

Next, a circuit configuration of the pixel in FIG. 1 will be described with reference to FIG. 2. FIG. 2 is an equivalent circuit diagram illustrating a structural example of the pixel included in the pixel portion 108 in FIG. 1.

A pixel shown in FIG. 2 includes a transistor 151, a liquid crystal element 152, and a capacitor 153.

In this specification, the transistor has at least a source, a drain, and a gate. As the transistor, a gate-insulated transistor can be used, for example.

The gate means the whole of a gate electrode and a gate wiring or part thereof. A conductive layer having a function of both a gate electrode and a gate wiring is referred to as a gate in some cases without distinction between the gate electrode and the gate wiring.

The source means the whole of a source electrode and a source wiring or part thereof. A conductive layer having a function of both a source electrode and a source wiring is referred to as a source in some cases without distinction between the source electrode and the source wiring.

The drain means the whole of a drain electrode and a drain wiring or part thereof. A conductive layer having a function of both a drain electrode and a drain wiring is referred to as a drain in some cases without distinction between the drain electrode and the drain wiring.

Further, in this specification, a source and a drain of a transistor may interchange with each other depending on the structure, the operating condition, and the like of the transistor; therefore, it is difficult to fix the source and the drain. Therefore, in this document (the specification, the claims, the drawings, or the like), one of them is referred to as one of the source and the drain, and the other is referred to as the other of the source and the drain.

One of a source and a drain of the transistor 151 is electrically connected to the signal line 154 and the gate thereof is electrically connected to a scan line 155.

The liquid crystal element 152 has a first terminal and a second terminal. The first terminal is electrically connected to the other of the source and the drain of the transistor 151, and the second terminal is electrically connected to a wiring 156. The liquid crystal element 152 can include a first electrode which serves as part of or the whole of the first terminal, a second electrode which serves as part of or the whole of the second terminal, and a liquid crystal layer whose transmittance of light is changed by application of voltage between the first electrode and the second electrode.

The specific resistance of a liquid crystal material of the liquid crystal element 152 is $1\times10^{12}\Omega\cdot cm$ or more, preferably $1\times10^{13}\Omega\cdot cm$ or more, far preferably $1\times10^{14}\Omega\cdot cm$ or more. The specific resistance in this specification is defined as that measured at 20° C. In the case where a liquid crystal display device is formed using the liquid crystal material, the resistance of a portion serving as a liquid crystal element may be $1\times10^{11}\Omega\cdot cm$ or more, furthermore $1\times10^{12}\Omega\cdot cm$ or more in some cases because of an impurity mixed into a liquid crystal layer from an alignment film, a sealant, or the like.

The larger the specific resistance of the liquid crystal material is, the more the leakage current of the liquid crystal layer can be suppressed and the more the decrease over time of the voltage applied to the liquid crystal element in the display period can be suppressed. As a result, the display period can be extended, so that the frequency of signal writing can be decreased, which leads to reduction of power consumption of the liquid crystal display device.

The capacitor 153 has a first terminal and a second terminal. The first terminal is electrically connected to the other of the source and the drain of the transistor 151, and the second terminal is electrically connected to a wiring 157. The capacitor 153 serves as a storage capacitor and can include a first electrode which serves as part of or the whole of the first terminal, a second electrode which serves as part of or the whole of the second terminal, and a dielectric layer in which electric charge is accumulated by application of voltage between the first electrode and the second electrode. The capacitance of the capacitor 153 may be set in consideration of the off-state current of the transistor 151. In this embodiment, a transistor including a high-purity oxide semiconductor layer is used as the transistor 151, and therefore, a storage capacitor having capacitance which is less than or equal to 1/3, preferably less than or equal to 1/5 with respect to the liquid crystal capacitance of each pixel is sufficient to be provided. The capacitor 153 is not necessarily provided. Omission of the capacitor 153 can improve the aperture ratio of the pixel.

The wiring 156 serves as a voltage line to which a certain voltage is applied. For example, a common voltage (also referred to as a voltage $V_{COM}$) is applied to the wiring 156. The common voltage may be a positive voltage, a negative voltage, or ground potential.

The wiring 157 serves as a voltage line to which a certain voltage is applied. For example, a unit voltage is applied to the wiring 157. The unit voltage may be a common voltage.

Further, a switch may be provided between the second terminal of the liquid crystal element 152 and the wiring 156, and the switch may be turned on so that a common voltage is applied to the second terminal of the liquid crystal element 152 in a writing period and the switch may be turned off so that the second terminal of the liquid crystal element 152 has a floating state in a display period. It is preferable to use a transistor applicable to the transistor 151, as the switch. Accordingly, the voltage applied to the liquid crystal element 152 can be prevented from being fluctuated at the time of displaying a still image.

A switch may be provided between the second terminal of the capacitor 153 and the wiring 157, and the switch may be turned on so that a unit voltage is applied to the second terminal of the capacitor 153 in a writing period and the switch may be turned off so that the second terminal of the capacitor 153 has a floating state in a display period. It is preferable to use a transistor applicable to the transistor 151, as the switch. Accordingly, the voltage applied to the capacitor 153 can be prevented from being fluctuated at the time of displaying a still image. The above description is made on the configuration of the pixel shown in FIG. 2.

Next, a transistor applicable to the transistor included in the driver circuit 109A or the driver circuit 109B or the transistor 151 is described below.

As the transistor included in the driver circuit 109A or the driver circuit 109B or the transistor 151, a transistor including an oxide semiconductor layer functioning as a channel formation layer can be used, for example. The oxide semiconductor layer functioning as a channel formation layer of the transistor is an intrinsic (i-type) or a substantially intrinsic oxide semiconductor which is obtained by removing hydrogen that is an n-type impurity from an oxide semiconductor and highly purifying the oxide semiconductor such that an impurity other than a main component of the oxide semiconductor is not contained as much as possible. In other words, the oxide semiconductor layer has a feature in that it is made to be an i-type (intrinsic) semiconductor or made to be close thereto not by addition of an impurity but by thorough purification to remove an impurity such as hydrogen or water as much as possible.

As the oxide semiconductor, any of the following can be used: an oxide of four metal elements such as In—Sn—Ga—Zn—O; an oxide of three metal elements such as In—Ga—Zn—O, In—Sn—Zn—O, In—Al—Zn—O, Sn—Ga—Zn—O, Al—Ga—Zn—O, or Sn—Al—Zn—O; an oxide of two metal elements such as In—Zn—O, Sn—Zn—O, Al—Zn—O, Zn—Mg—O, Sn—Mg—O, In—Mg—O, or In—Sn—O; In—O; Sn—O; and Zn—O. Further, $SiO_2$ may be included in the oxide semiconductor.

As the oxide semiconductor, a material represented by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like. Among the oxide semiconductors represented by $InMO_3(ZnO)_m$ (m>0), an oxide semiconductor which includes Ga as M is referred to as an In—Ga—Zn—O oxide semiconductor.

Furthermore, the bandgap of the oxide semiconductor used as the oxide semiconductor layer is 2 eV or more, preferably 2.5 eV or more, far preferably 3 eV or more. Accordingly, the number of carriers generated by thermal excitation can be reduced to a negligible number. Further, the amount of impurity such as hydrogen which becomes a donor is reduced to a certain amount or less so that the carrier concentration is less than $1\times10^{14}/cm^3$, preferably $1\times10^{12}/cm^3$ or less. That is, the carrier concentration of the oxide semiconductor layer is reduced to as close to zero as possible.

The purification is carried out under at least one of the following concepts: removal of hydrogen from an oxide semiconductor layer as much as possible; and reduction of defects, which are caused by oxygen deficiency in an oxide semiconductor layer, by supply of oxygen to the oxide semiconductor layer.

In the above-described transistor including the oxide semiconductor layer, the off-state current per channel width of 1 μm can be reduced to 10 aA/μm ($1\times10^{-17}$ A/μm) or less, further to 1 aA/μm ($1\times10^{-18}$ A/μm) or less, still further to 10 zA/μm ($1\times10^{-20}$ A/μm) or less.

In the case where a liquid crystal display device is formed using the transistor off-state current of which is extremely small as described above, the display period of an image per writing of image data can be long because the leakage current due to the transistor is extremely small. Therefore, the interval between writings of mage data can be prolonged. Further, the frame frequency can be lowered. For example, the writing interval of image data can be prolonged to 10 seconds or longer, preferably 30 seconds or longer, far preferably 1 minute or longer. In addition, power consumption at the time of displaying a still image can be reduced. As the interval between writings of image data is prolonged, power consumption can be reduced.

Further, in the above-described transistor including the oxide semiconductor layer, fluctuation of the electrical characteristics depending on the temperature is small; for example, the dependency of the on-state current or the off-state current of the transistor on the temperature in the range from −30° C. to 120° C. can be considered to be zero.

Next, a driving method of the liquid crystal display device shown in FIG. 1 including the pixel shown in FIG. 2 is described below.

In the driving method of the liquid crystal display device shown in FIG. 1, data of an image signal is input to the memory circuit 103.

The memory circuit 103 holds data of image signals of sequential frame periods, and outputs the data of the image signals to the comparison circuit 104 as image signals.

The comparison circuit 104 compares input data of image signals of the sequential frame periods (e.g., a first frame period and a second frame period) with each other and detects a difference thereof, thereby judging whether an image is a moving image or a still image on the basis of the compared data of the image signals. When a difference is detected, the image is judged to be a moving image; when no difference is detected, the image is judged to be a still image.

In the case where images are judged to be a moving image on the basis of the comparison of data of the image signals, the selection circuit 105 outputs the data of the image signals held in the memory circuit 103 as image signals to the display control circuit 106. Furthermore, in that case, the display control circuit 106 supplies data of the input image signals as image signals to the driver circuit portion 107.

On the other hand, in the case where images are judged to be a still image on the basis of the comparison of data of the image signals, a supply of the image signal for the latter frame period (e.g., the second frame period) to the display control circuit 106 is stopped. Furthermore, in that case, a supply of the image signal for the latter frame period (e.g., the second frame period) to the driver circuit portion 107 is stopped. Further, in addition to the image signal, the supply of one or more of the clock signal CK, the start signal SP, the reset signal Res, the high power source voltage Vdd, and the low power source voltage Vss to the driver circuit portion 107 can be stopped. By stopping the supply of the above-described signal(s) and/or voltage(s), the driver circuit portion can be stopped operating during the period in which the still image is displayed.

Further, in the case where data of the image signal in the first frame period is the same as data of an image signal in the preceding frame period, i.e., images displayed in the two sequential frame periods are a still image, a supply of the image signal to the driver circuit portion 107 can be stopped and a supply of the image signal from the driver circuit portion 107 to the pixel portion 108 can be stopped in the first frame period. Further, in that case, the supply of one or more of the clock signal CK, the start signal SP, the reset signal Res, the high power source voltage Vdd, and the low power source voltage Vss to the driver circuit portion 107 can be stopped, whereby power consumption can be reduced.

As described above, according to one example of the driving method of the liquid crystal display device in this embodiment, data of a plurality of image signals is compared with each other, so that whether images to be displayed are a moving image or a still image is judged, and the supply of a control signal such as a clock signal or a start signal to the driver circuit portion is selectively restarted or stopped. By selectively performing the supply of a signal or a voltage to the driver circuit portion, a period during which the driver circuit portion is stopped operating can be provided, which leads to reduction of power consumption of the liquid crystal display device.

Moreover, in the liquid crystal display device of this embodiment, since the transistor using an oxide semiconductor whose off-state current is smaller than that of an amorphous silicon TFT as descried above, a display period of an image by one image-data writing can be long.

Figure 3:
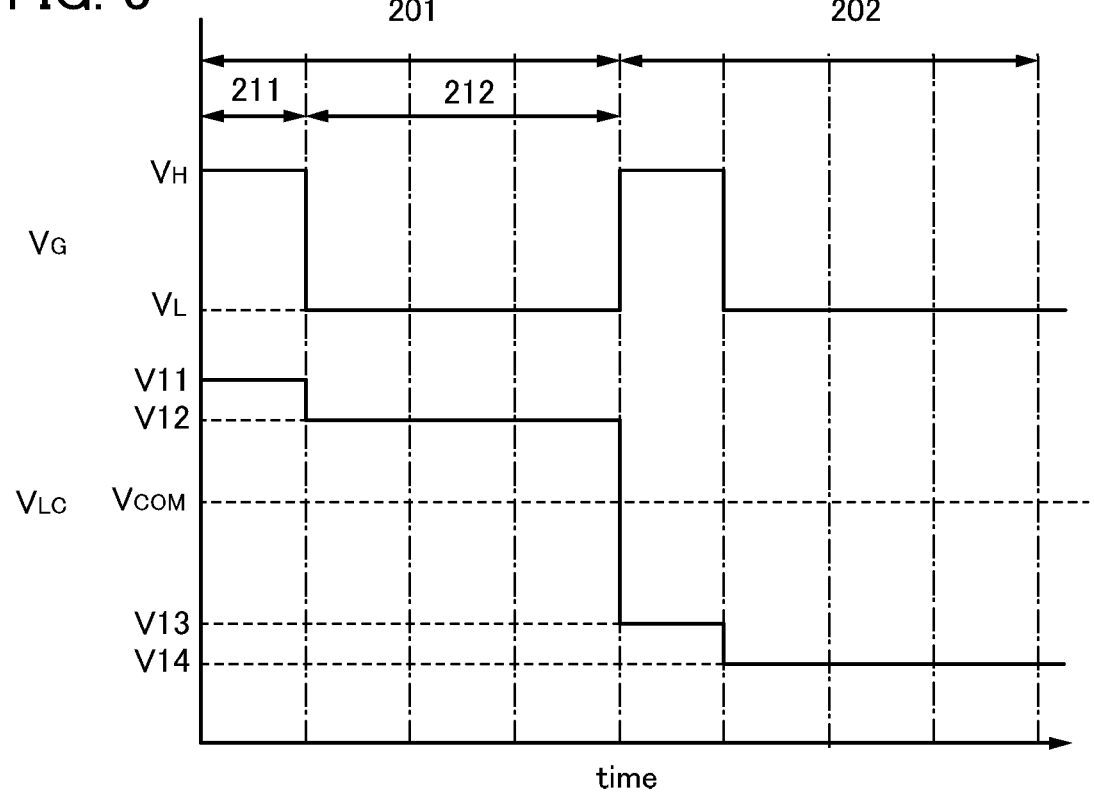
FIG. 3 illustrates an operation example of a liquid crystal display device in Embodiment 1.

Further, an example of a writing operation and a display operation of a pixel is described below with reference to FIG. 3. FIG. 3 is a timing chart for describing an example of a writing operation and a display operation of the pixel of this embodiment.

For the pixel, a writing period 211 and a display period (also referred to as a holding period) 212 are provided in each of a first frame period 201 and a second frame period 202.

In the writing period 211, as shown in FIG. 3, a scan signal which is input through a scan line is active (the scan signal (also referred to as $V_G$) is at high level in FIG. 3). Then, the transistor 151 in the pixel is turned on, and a voltage of an image signal is supplied to the first terminal of the liquid crystal element 152 and the first terminal of the capacitor 153 via the transistor 151, whereby image data is written. In the display period 212, the pixel keeps a display state corresponding to the written image data.

Furthermore, in the liquid crystal display device of this embodiment, in order to suppress image burn-in on the display panel 101, a driving method is employed in which the supply of an image signal to the driver circuit portion 107 is restarted and the polarity of the voltage applied to the liquid crystal element 152 is inverted in the case where still image is displayed in sequential frame periods the number of which exceeds a predetermined number (the driving method also referred to as a frame inversion driving). Namely, in the case where still image is displayed using a plurality of frame periods that can be regarded as being the same image, the polarity inversion of the voltage applied to the liquid crystal element 152 is conducted only when the number of the sequential frame periods exceed a standard value. For example, when a still image is displayed using first to (n+1)-th frame periods (n is a natural number larger than 1), after the data of the image signal of the first frame period is supplied to the liquid crystal element 152 through the driver circuit portion 107, the supply of the data is stopped in the sequential second to n-th frame periods. Then, the inversion of the voltage is carried out between the n-th and (n+1)-th frame periods. Note that the polarity inversion of the voltage may be conducted using a common voltage as a standard. The driving method of the liquid crystal display device of this embodiment is not limited to this example; another driving method such as a scan-line inversion driving, a signal-line inversion driving, a dot inversion driving, or a common-voltage inversion driving may be employed.

The supply of the image signal is restarted at a timing at which the number of frame periods during which one still image is displayed continuously exceeds a predetermined number. The number of frame periods can be counted by a counting circuit provided, for example. In that case, the supply of the image signal to the driver circuit portion 107 is restarted when the counting value of the counting circuit exceeds a predetermined value, and the polarity of the voltage applied to the liquid crystal element 152 is inverted. In the timing chart shown in FIG. 3, the counting value exceeds the predetermined value in the second frame period 202, the supply of the image signal to the driver circuit portion 107 is restarted, and the polarity of the voltage applied to the liquid crystal element 152 is inverted. In addition, in the case where the supply of one or more of the clock signal CK, the start signal SP, the reset signal Res, the high power source voltage Vdd, and the low power source voltage Vss to the driver circuit portion 107 is stopped at the same time as the time at which the supply of the image signal to the driver circuit portion 107 is stopped, the supply of one or more of the clock signal CK, the start signal SP, the reset signal Res, the high power source voltage Vdd, and the low power source voltage Vss to the driver circuit portion 107 may be restarted.

In the case where data of respective image signals in sequential two frame periods (e.g., a first frame period and a second frame period) are compared with each other using the image signals input, and an image in the second frame period is judged to be the same as an image in the first frame period, it is preferable that absolute values of the voltages applied to the liquid crystal element 152 in the sequential frame periods be equal to each other.

However, as shown in FIG. 3, in some cases, the voltage applied to the liquid crystal element 152 (the voltage also referred to as a voltage $V_{LC}$) changes from ($V11-V_{COM}$) to ($V12-V_{COM}$) in the first frame period 201 and the voltage applied to the liquid crystal element 152 changes from ($V13-V_{COM}$) to ($V14-V_{COM}$) in the second frame period 202, which may result in a difference between an absolute value of a difference between the voltage (data) of an image signal in the first frame period 201 and a common voltage (the absolute value is an absolute value of the voltage applied to the liquid crystal element 152 in the first frame period 201) and an absolute value of a difference between the voltage (data) of an image signal in the second frame period 202 and the common voltage (the absolute value is an absolute value of the voltage applied to the liquid crystal element 152 in the second frame period 202). Such a voltage fluctuation is caused by feedthrough or the like, and causes deterioration of the display quality (e.g., generation of a flicker). The longer the display period by one image-data writing is, the more the voltage fluctuation may affect.

In view of the above, compensation is performed in an example of the driving method of the liquid crystal display device of this embodiment. In the case where the absolute value of the voltage applied to the liquid crystal element 152 in the first frame period 201 is different from that of the voltage applied to the liquid crystal element 152 in the second frame period 202, the voltage applied to the liquid crystal element 152 is compensated in the first frame period 201 or the second frame period 202. In that case, the compensation is preferably performed such that the gray scale level of the pixel at the voltage applied to the liquid crystal element 152 in the first frame period 201 is equal to that of the pixel at the voltage applied to the liquid crystal element 152 in the second frame period 202. For example, the voltage $V_{COM}$ may be compensated, so that the voltage applied to the liquid crystal element 152 can be compensated, whereby the gray scale level can be compensated. The voltage applied to the capacitor 153 may be compensated. For example, the unit voltage applied to the second terminal of the capacitor 153 is compensated, thereby compensating the voltage applied to the capacitor 153.

Figure 4:
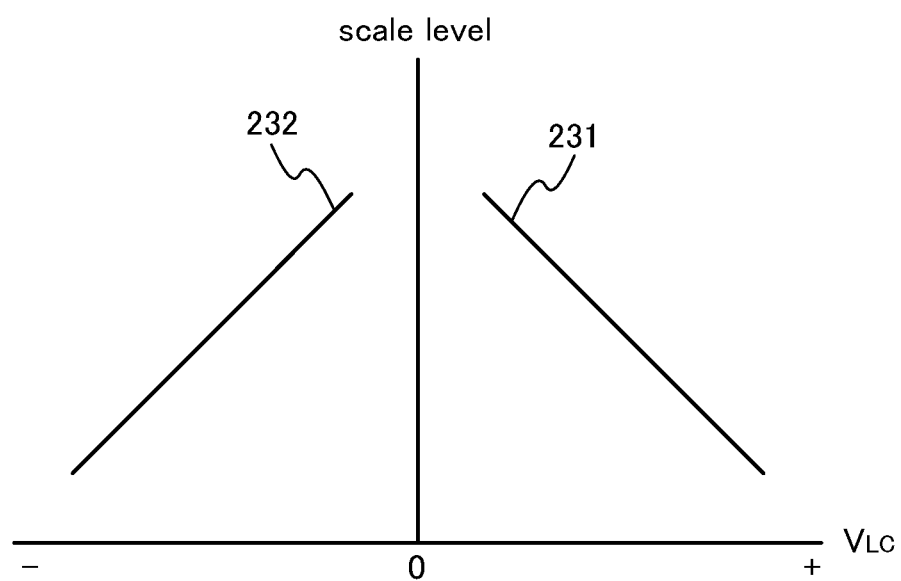
FIG. 4 illustrates an operation example of a liquid crystal display device in Embodiment 1.

The gray scale level of the pixel at the voltage applied to the liquid crystal element 152 can be represented on the vertical axis of a graph with the voltage applied to the liquid crystal element (also referred to as a voltage $V_{LC}$) represented on the horizontal axis, for example. For example, in the case where TN liquid crystal is used as a liquid crystal material, the gray scale level at a positive voltage $V_{LC}$ and the gray scale level at a negative voltage $V_{LC}$ can be expressed by a straight line 231 and a straight line 232 in FIG. 4, respectively. As the gray scale level increases, the image gets closer to white display; as the gray scale level decreases, the image gets closer to black display.

For example, in the case where the absolute value of the voltage applied to the liquid crystal element 152 in the first frame period 201 is smaller than that of the voltage applied to the liquid crystal element 152 in the second frame period 202, the voltage $V_{COM}$ is shifted to be decreased, so that the voltage applied to the liquid crystal element 152 can be lowered, whereby the gray scale level of the pixel at the voltage applied to the liquid crystal element 152 in the first frame period 201 and that of the pixel at the voltage applied to the liquid crystal element 152 in the second frame period 202 can be the same or as close to each other as possible. When a still image is displayed using first to (n+1)-th frame periods (n is a natural number larger than 1), for example, the inversion of the voltage is carried out between the n-th and (n+1)-th frame periods, and the compensation is performed so that the voltage applied to the liquid crystal element 152 in the n-th frame period is the same as that in the (n+1)th frame period.

The compensation may be performed before the image signal supply to the driver circuit portion after an image formed by the images of the sequential frame periods are judged to be a still image by the comparison circuit 104. In that case, a compensation circuit is provided, the absolute value of the voltage applied to the liquid crystal element 152 in the first frame period 201 is compared with that of the voltage applied to the liquid crystal element 152 in the second frame period 202 in the comparison circuit 104, comparison data is output to the comparison circuit, and the voltage applied to the liquid crystal element 152 is compensated by the compensation circuit in accordance with the compensation data.

The voltage applied to the liquid crystal element 152 may be compensated while comparing respective images displayed on the display panel in the first frame period 201 and the second frame period 202. The frame frequency may be lowered to about 1/10 of the normal one at the time of the compensation and returned to the normal one at the time of display. Lowering of the frame frequency enables more accurate compensation.

As described above, according to one example of the driving method of the liquid crystal display device of this embodiment, in the case where respective images in the first frame period and the second frame period are compared with each other, so that the image formed by the images of the first and second frame periods is judged to be a still image with respect to the image of the first frame period, and the absolute value of the voltage applied to the liquid crystal element in the first frame period is different from that of the voltage applied to the liquid crystal element in the second frame period, the voltage applied to the liquid crystal element is compensated in the first frame period or the second frame period. Accordingly, even in the case where a still image is displayed for a long time by applying to the liquid crystal element a voltage whose polarity is inverted in a plurality of sequential frame periods, deterioration of the display quality due to voltage fluctuation can be suppressed. For example, generation of a flicker can be suppressed. Therefore, in the case where a transistor including an oxide semiconductor layer functioning as a channel formation layer is used as in the liquid crystal display device of this embodiment and a still image is displayed for a long period by one image-data writing, the display quality can be prevented from deteriorating and power consumption can be reduced by the driving method of the liquid crystal display device of this embodiment.

(Embodiment 2)

In Embodiment 2, a structure of a shift register included in each of a scan line driver circuit and a signal line driver circuit of the liquid crystal display device described in Embodiment 1 will be described.

Figure 5A:
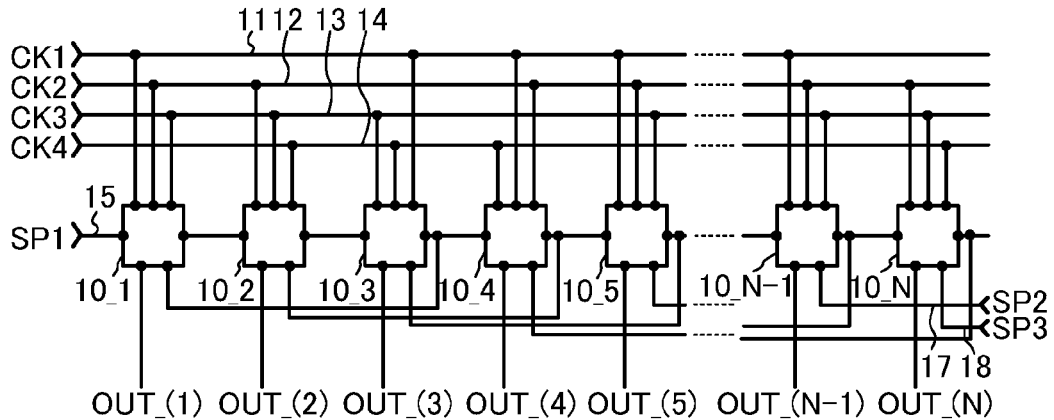
FIGS. 5A to 5C illustrate a structure example of a driver circuit in Embodiment 2.
Figure 5B:
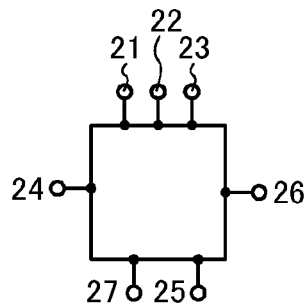
Figure 5C:
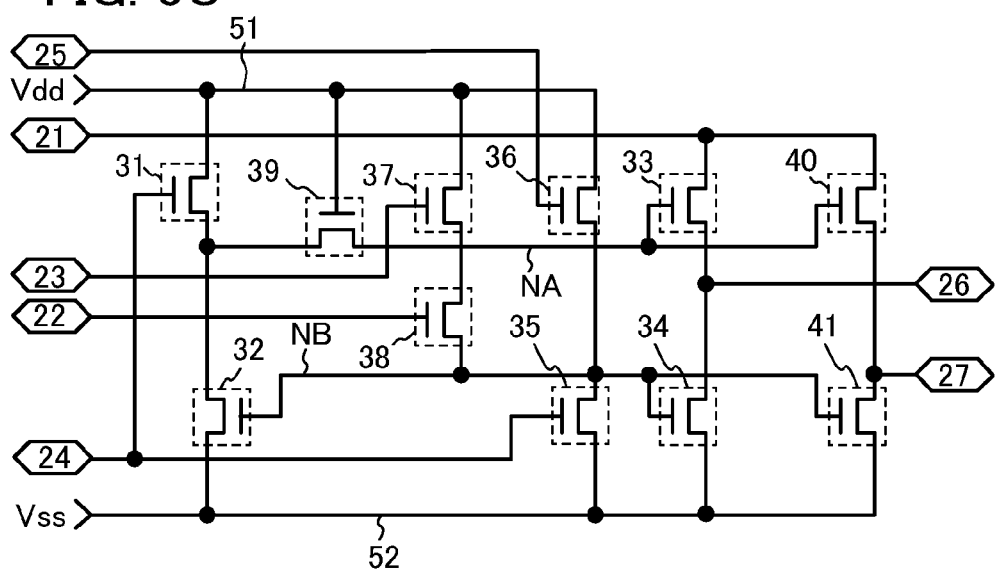

An example of the structure of the shift register in this embodiment is described with reference to FIGS. 5A to 5C. FIGS. 5A to 5C are diagrams illustrating an example of the structure of the shift register in this embodiment.

A shift register shown in FIG. 5A includes first to N-th pulse output circuits 10_1 to 10_N (N is a natural number greater than or equal to 3).

Each of the first to N-th pulse output circuits 10_1 to 10_N is electrically connected to three wirings among first to fourth wirings 11 to 14. In the shift register shown in FIG. 5A, a first clock signal CK1 is supplied through the first wiring 11, a second clock signal CK2 is supplied through the second wiring 12, a third clock signal CK3 is supplied through the third wiring 13, and a fourth clock signal CK4 is supplied through the fourth wiring 14.

A start signal SP1 is input to the first pulse output circuit 10_1 through a fifth wiring 15.

A signal from the pulse output circuit 10_(n−1) (n is a natural number of 2 or more and N or less) in the previous stage (the signal referred to as a former-stage signal OUT(n−1)) is input to the n-th pulse output circuit 10_n in a second or subsequent stage. Further, a signal from a third-pulse output circuit 10_3 in the third stage is input to the first pulse output circuit 10_1 in the first stage; similarly, a signal from the (l+2)-th pulse output circuit 10_(l+2) (l is a natural number of 2 or more and N−2 or less) in the (l+2)-th stage (the signal referred to as a later-stage signal OUT(l+2)) is input to the l-th pulse output circuit 10_l in the l-th stage. Further, each pulse output circuit in each stage outputs a first output signal and a second output signal. As shown in FIG. 5A, the later-stage signals OUT(l+2) are not input to the pulse output circuits in the (N−1)-th stage and the N-th stage; therefore, for example, a start signal SP2 may be input to the pulse output circuit in the (N−1)-th stage through a sixth wiring 17 and a start signal SP3 may be input to the pulse output circuit in the N-th stage through a eighth wiring 18. Alternatively, signals internally generated may be input to the pulse output circuits in the (N−1)-th stage and the N-th stage. For example, a pulse output circuit 10_(N+1) in the (N+1)-th stage and a pulse output circuit 10_(N+2) in the (N+2)-th stage (the circuits also referred to as pulse output circuits in dummy stages) which do not contribute to pulse output to the pixel portion may be provided, a start signal SP2 may be input to the pulse output circuit 10_(N+1) in the (N+1)-th stage and a start signal SP3 may be input to the pulse output circuit 10_(N+2) in the (N+2)-th stage.

Each of the first clock signal (CK1) to the fourth clock signal (CK4) is a digital signal whose level is repeatedly switched between high level and low level. The first to the fourth clock signals (CK1) to (CK4) are delayed by ¼ period sequentially. In this embodiment, driving of the pulse output circuit or the like is controlled with the first to fourth clock signals (CK1) to (CK4).

Each of the first to N-th pulse output circuits 10_1 to 10_N has a first input terminal 21, a second input terminal 22, a third input terminal 23, a fourth input terminal 24, a fifth input terminal 25, a first output terminal 26, and a second output terminal 27 (see FIG. 5B).

The first input terminal 21, the second input terminal 22, and the third input terminal 23 are electrically connected to three wirings among the first to fourth wirings 11 to 14. For example, in the first pulse output circuit 10_1 in FIGS. 5A and 5B, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

In the first pulse output circuit 10_1 in FIGS. 5A and 5B, the start signal is input through the fourth input terminal 24, the later-stage signal (the second output signal of the third pulse output circuit 10_3) is input through the fifth input terminal 25, the first output signal is output through the first output terminal 26, and the second output signal is output through the second output terminal 27.

Next, an example of a specific circuit configuration of the pulse output circuit is described below with reference to FIG. 5C.

A pulse output circuit shown in FIG. 5C includes first to eleventh transistors 31 to 41.

One of a source and a drain of the first transistor 31 is electrically connected to a power supply line 51, and a gate thereof is electrically connected to the fourth input terminal 24.

One of a source and a drain of the second transistor 32 is electrically connected to a power supply line 52.

One of a source and a drain of the third transistor 33 is electrically connected to the first input terminal 21, and the other of the source and the drain thereof is electrically connected to the first output terminal 26.

One of a source and a drain of the fourth transistor 34 is electrically connected to the power supply line 52, the other of the source and the drain thereof is electrically connected to the first output terminal 26, and a gate thereof is electrically connected to a gate of the second transistor 32.

One of a source and a drain of the fifth transistor 35 is electrically connected to the power supply line 52, the other of the source and the drain thereof is electrically connected to the gate of the second transistor 32, and a gate thereof is electrically connected to the fourth input terminal 24.

One of a source and a drain of the sixth transistor 36 is electrically connected to the power supply line 51, the other of the source and the drain thereof is electrically connected to the gate of the second transistor 32, and a gate thereof is electrically connected to the fifth input terminal 25.

One of a source and a drain of the seventh transistor 37 is electrically connected to the power supply line 51, and a gate thereof is electrically connected to the third input terminal 23.

One of a source and a drain of the eighth transistor 38 is electrically connected to the gate of the second transistor 32, the other of the source and the drain thereof is electrically connected to the other of the source and the drain of the seventh transistor 37, and a gate thereof is electrically connected to the second input terminal 22.

One of a source and a drain of the ninth transistor 39 is electrically connected to the other of the source and the drain of the first transistor 31 and the other of the source and the drain of the second transistor 32, the other of the source and the drain thereof is electrically connected to a gate of the third transistor 33, and a gate thereof is electrically connected to the power supply line 51.

One of a source and a drain of the tenth transistor 40 is electrically connected to the first input terminal 21, the other of the source and the drain thereof is electrically connected to the second output terminal 27, and a gate thereof is electrically connected to the other of the source and the drain of the ninth transistor 39.

One of a source and a drain of the eleventh transistor 41 is electrically connected to the power supply line 52, the other of the source and the drain thereof is electrically connected to the second output terminal 27, and a gate thereof is electrically connected to the gate of the second transistor 32.

In FIG. 15C, a portion where the gate of the third transistor 33, the gate of the tenth transistor 40, and the other of the source and the drain of the ninth transistor 39 are connected to one another is referred to as a node NA. In addition, a portion where the gate of the second transistor 32, the gate of the fourth transistor 34, the other of the source and the drain of the fifth transistor 35, the other of the source and the drain of the sixth transistor 36, the other of the source and the drain of the eighth transistor 38, and the gate of the eleventh transistor 41 are connected to one another is referred to as a node NB.

For example, in the first pulse output circuit 10_1, the first clock signal CK1 is input through the first input terminal 21, the second clock signal CK2 is input through the second input terminal 22, the third clock signal CK3 is input through the third input terminal 23, the start signal SP1 is input to the fourth input terminal 24, and a signal output through the first output terminal 26 of the third pulse output circuit 10_3 is input through the fifth input terminal 25. In addition, the first pulse output circuit 10_1 outputs a pulse signal through the first output terminal 26, and outputs a signal OUT(1) through the second output terminal 27.

Figure 6:
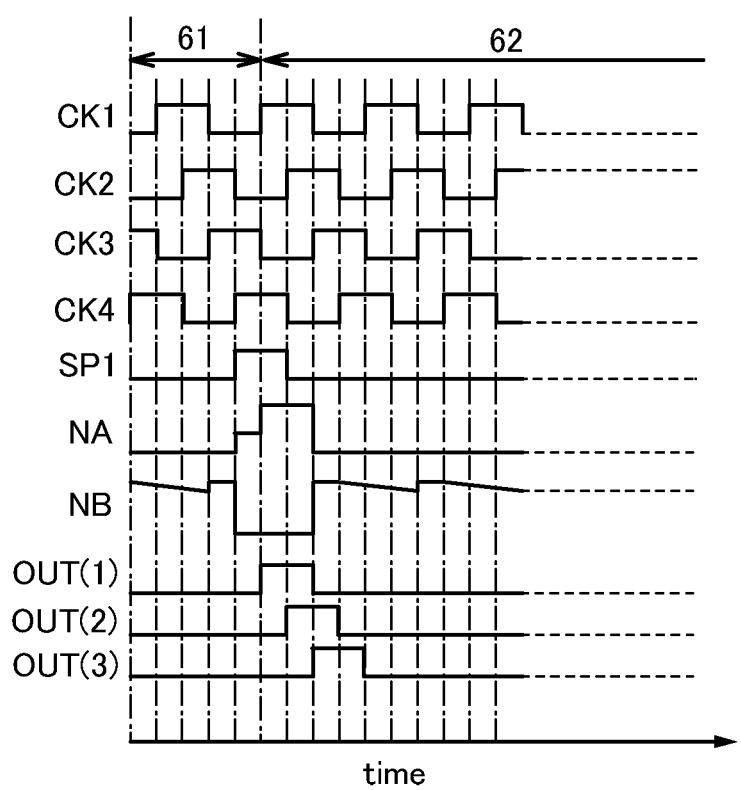
FIG. 6 illustrates an operation example of a driver circuit in Embodiment 2.

A timing chart of the signals in the shift register shown in FIGS. 5A to 5C is illustrated in FIG. 6. In the case where the shift register is included in a scan line driver circuit, a period 61 in FIG. 6 corresponds to a vertical retrace period and a period 62 corresponds to a gate selection period.

Figure 7:
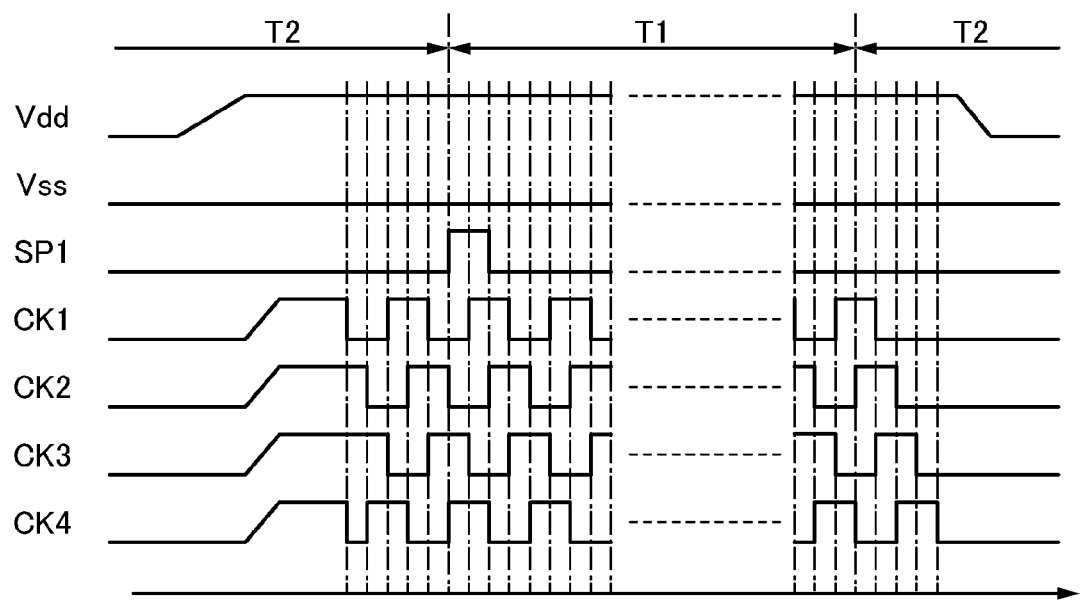
FIG. 7 illustrates an operation example of a driver circuit in Embodiment 2.

The liquid crystal display device to which the driving method of the liquid crystal display device which is one embodiment of the present invention can be applied can display a still image and a moving image and display a still image by refresh operation without constantly operating the driver circuit portion. A signal or voltage supply operation to each wiring in the case where a moving image is displayed after the still image display is displayed and a stop operation of a signal or voltage supply to each wiring of the driver circuit portion at the time of a rewriting operation (refresh operation) of a voltage applied to the liquid crystal element in the scan line driver circuit or the signal line driver circuit using the shift register shown as an example in FIGS. 5A to 5C is described below with reference to FIG. 7. FIG. 7 illustrates changes in voltages, before and after a first frame period (T1), of a wiring for supplying the high power supply voltage (VDD), a wiring for supplying the low power supply voltage (VSS), a wiring for supplying the start signal (SP1), and wirings for supplying the first to fourth clock signals CK1 to CK4 to the shift register.

As shown in FIG. 7, according to the operation of the shift register of this embodiment, a period in which the high power supply voltage and control signals such as the first to fourth clock signals and the start signal are supplied and a period in which the control signals are not supplied exist. The first frame period T1 in FIG. 7 corresponds to the period in which the control signals are supplied, in other words, a period in which a moving image is displayed or a period in which refresh operation is performed. A second frame period T2 in FIG. 7 corresponds to the period in which the control signals are not supplied, in other words, a period in which a still image is displayed.

In FIG. 7, a period in which the high power supply voltage is supplied is not only in the first frame period but also in a part of the second frame period which moves to/from the first frame. Also in FIG. 7, a period in which one or more of the first to fourth clock signals is supplied is after the supply of the high power supply voltage is started and before the supply is stopped.

Further, as shown in FIG. 7, the wirings for supplying the first to fourth clock signals CK1 to CK4 may be set such that they become high once before the first frame period, then start oscillating their respective clock signals CK1 to CK4 at a constant frequency, and they become low once after the first frame period, and then stop oscillating the clock signals.

As described above, in the shift register of this embodiment, the supply of the high power supply voltage and the control signals such as the first to fourth clock signals and the start signal to the shift register is stopped in the beginning or the ending of the second frame period. In addition, in the period in which the supply of the high power supply voltage and the control signals such as the first to fourth clock signals and the start signal is stopped, an output of the pulse signal from the shift register is also stopped. Accordingly, power consumption of the shift register and power consumption of the pixel portion which is driven by the shift register can be reduced.

In the period in which the supply of the high power supply voltage to the shift register is stopped, the voltage of the wiring for supplying the high power supply voltage can have the same value as the low power supply voltage (Vss) as shown in FIG. 7. The wiring for supplying the high power supply voltage may be in a floating state, thereby stopping the supply of the high power supply voltage.

When the voltage of the wiring for supplying the high power supply voltage is increased, that is, the voltage is increased from the low power supply voltage to the high power supply voltage before the first frame period, it is preferable to control the voltage of the wiring so as to change gradually. This is because, in the case where the voltage of the wiring for supplying the high power supply voltage is increased, a steep change of the voltage of the wiring may become noise, which may fluctuate the waveform of the pulse signal output from the shift register and may change the voltage applied to the liquid crystal element due to this fluctuation of the waveform, which leads to a change of a still image. In view of the above, FIG. 7 illustrates an example in which a rise in the voltage of the wiring for supplying the high power supply voltage is more gradual than a fall in the same. Particularly, in the shift register of this embodiment, the supply of the high power supply voltage is stopped or restarted as appropriate in a period in which a still image is displayed on the pixel portion. In other words, since a fluctuation in the voltage for supplying the high power supply voltage which enters the pixel portion as a noise leads to deterioration of the display quality, it is important to perform control such that the fluctuation in the voltage for supplying the high power supply voltage (particularly, an increase in the voltage) does not enter the pixel portion as a noise.

This embodiment can be combined with or replaced by any of other embodiments as appropriate.

(Embodiment 3)

In Embodiment 3, an example of a transistor which is applicable as the transistor included in the liquid crystal display device described in Embodiment 1 will be described.

A transistor in this embodiment is described below with reference to FIGS. 8A to 8D. FIGS. 8A to 8D are views for illustrating the transistor described in Embodiment 1.

A process for manufacturing a transistor 410 over a substrate 400 is described below with reference to FIGS. 8A to 8D.

First, a conductive film is formed over the substrate 400 having an insulating surface, a resist mask is formed over the conductive film by a first photolithography process, and then, the conductive film is etched using the resist mask, so that a gate electrode layer 411 is formed. After that, the resist mask is removed. The resist mask may be formed by an inkjet method. Formation of a resist mask by an inkjet method does not use a photomask, so that the manufacturing cost can be reduced.

Although there is no particular limitation on a substrate which can be used as the substrate 400 having an insulating surface, it is necessary that the substrate have at least enough heat resistance to a heat treatment performed later. For example, as the substrate 400, a glass substrate of barium borosilicate glass, aluminoborosilicate glass, or the like can be used. As a glass substrate, if the temperature of the heat treatment performed later is high, a glass substrate whose strain point is 730° C. or higher is preferably used.

In the transistor in this embodiment, an insulating film which functions as a base film may be provided between the substrate 400 and the gate electrode layer 411. The base film has a function of preventing diffusion of an impurity element from the substrate 400, and can be formed with a single film or a plurality of films using one or more of a silicon nitride film, a silicon oxide film, a silicon nitride oxide film, and a silicon oxynitride film.

The gate electrode 411 can be formed with a single layer or a plurality of stacked layers using one or more selected from metals such as molybdenum, titanium, chromium, tantalum, tungsten, aluminum, copper, neodymium, scandium, and the like and alloy materials using such a metal as a main component.

For example, the gate electrode 411 can be formed with a stacked layer in which a molybdenum layer is stacked on an aluminum layer, a stacked layer in which a molybdenum layer is stacked on a copper layer, a stacked layer in which a titanium nitride layer or a tantalum nitride layer is stacked on a copper layer, or a stacked layer in which a titanium nitride layer and a molybdenum layer are stacked. Alternatively, the gate electrode 411 can be formed with a stacked layer in which a tungsten layer or a tungsten nitride layer, an alloy layer of aluminum and silicon or an alloy layer of aluminum and titanium, and a titanium nitride layer or a titanium layer are stacked.

Next, a gate insulating layer 402 is formed over the gate electrode layer 411.

The gate insulating layer 402 can be formed to have a single-layer structure or a stacked-layer structure including one or more selected from a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed using a deposition gas containing silane ($SiH_4$), oxygen, and nitrogen by a plasma CVD method. A layer including a high-k material such as hafnium oxide ($HfO_x$) or tantalum oxide ($TaO_x$) can be used as the gate insulating layer 402. The thickness of the gate insulating layer 402 is greater than or equal to 100 nm and less than or equal to 500 nm in this embodiment; in the case of a stacked-layer structure, for example, the gate insulating layer 402 is formed by stacking a first gate insulating layer with a thickness greater than or equal to 50 nm and less than or equal to 200 nm and a second gate insulating layer with a thickness greater than or equal to 5 nm and less than or equal to 300 nm.

In this embodiment, a silicon oxynitride layer having a thickness of 100 nm is formed by a plasma CVD method as the gate insulating layer 402.

Note that as the gate insulating layer 402, a silicon oxynitride film may be formed using a high-density plasma apparatus. Here, the high-density plasma apparatus refers to an apparatus which can realize a plasma density higher than or equal to $1 \times 10^{11}/cm^3$. For example, plasma is generated by applying a microwave power higher than or equal to 3 kW and lower than or equal to 6 kW so that an insulating film is formed.

For example, silane ($SiH_4$), nitrous oxide ($N_2O$), and a rare gas are introduced into a chamber as a source gas and a pressure higher than or equal to 10 Pa and lower than or equal to 30 Pa is applied, which is followed by application of high-density plasma, so that an insulating film is formed over the substrate having an insulating surface, such as a glass substrate. After that, the supply of silane ($SiH_4$) may be stopped, and nitrous oxide ($N_2O$) and a rare gas may be introduced without exposure of the insulating film to the air to perform plasma treatment on a surface thereof. The insulating film formed through the above process can ensure the reliability even if the thickness is as small as 100 nm.

At the time of the formation of the gate insulating layer 402, the flow ratio of silane ($SiH_4$) to nitrous oxide ($N_2O$) which are introduced into the chamber is in the range of 1:10 to 1:200. As the rare gas which is introduced into the chamber, helium, argon, krypton, xenon, or the like can be used; of these, argon, which is inexpensive, is preferably used.

Since the insulating film formed using the high-density plasma apparatus can have uniform thickness, the insulating film has high step coverage. Further, as for the insulating film formed using the high-density plasma apparatus, the thickness of a thin film can be controlled precisely.

The insulating film formed through the above process is greatly different from the insulating film formed using a conventional parallel plate plasma CVD apparatus. The etching rate of the insulating film formed through the above process is lower than that of the insulating film formed using the conventional parallel plate plasma CVD apparatus by 10% or more or 20% or more with the use of the same etchant, which means that the insulating film formed using the high-density plasma apparatus is a dense film.

An oxide semiconductor (a highly purified oxide semiconductor) layer which is made to be intrinsic (i-type) or substantially intrinsic in a later step is highly sensitive to an interface state and interface charge; thus, an interface between the oxide semiconductor layer and the gate insulating layer is important. For that reason, the gate insulating layer that is to be in contact with the highly-purified oxide semiconductor needs to have high quality. For example, an insulating film is formed using a high-density plasma CVD apparatus with microwaves (2.45 GHz), so that a high-quality insulating film which is dense and has high dielectric strength voltage can be formed. The highly purified oxide semiconductor layer is in contact with the high-quality gate insulating layer, whereby the interface states can be reduced and interface properties can be favorable. As described above, it is important to form a favorable interface with lower interface state density between the oxide semiconductor layer and the gate insulating layer in addition to forming a gate insulating layer with high film quality.

Next, an oxide semiconductor film 430 is formed to a thickness greater than or equal to 2 nm and less than or equal to 200 nm over the gate insulating layer 402. Before the oxide semiconductor film 430 is formed by a sputtering method, powdery substances (also referred to as particles or dust) which are attached on a surface of the gate insulating layer 402 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is generated to modify the surface of the substrate. Instead of the argon atmosphere, a nitrogen atmosphere, a helium atmosphere, an oxygen atmosphere, or the like may be used.

As the oxide semiconductor film 430, any of the following oxide semiconductor films can be used: an In—Ga—Zn—O-based oxide semiconductor film; an In—Sn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. For example, in the case of using an In—Ga—Zn—O-based oxide semiconductor film, it is preferable that the thickness thereof is greater than or equal to 5 nm and less than or equal to 200 nm. In this embodiment, a 20-nm-thick In—Ga—Zn—O-based oxide semiconductor film is formed by a sputtering method using an In—Ga—Zn—O-based metal oxide target as the oxide semiconductor film 430. A cross-sectional view in this step is FIG. 8A. The oxide semiconductor film 430 can be formed by a sputtering method in a rare gas (typically argon) atmosphere, an oxygen atmosphere, or an atmosphere including a rare gas (typically argon) and oxygen. In the case of using a sputtering method, it is preferable to use a target containing $SiO_2$ at 2 wt % to 10 wt % to make $SiO_x$ (x>0) that inhibits crystallization be contained in the oxide semiconductor film in order to suppress crystallization at the time of heat treatment for dehydration or dehydrogenation in a later step.

In this embodiment, the oxide semiconductor film 430 is formed as follows: a metal oxide target containing In, Ga, and Zn ($In_2O_3$:$Ga_2O_3$:ZnO=1:1:1 [in a molar ratio], In:Ga:Zn=1: 1:0.5 [in an atomic ratio]) is used; the distance between the substrate and the target is 100 mm; the pressure is 0.2 Pa; the direct current (DC) power is 0.5 kW; and the atmosphere is a mixed atmosphere of argon and oxygen (argon:oxygen=30 sccm:20 sccm, the oxygen flow rate is 40%). A pulse direct current (DC) power supply is preferably used because powder substances generated at the time of film deposition can be reduced and the film thickness can be made uniform. As the metal oxide target containing In, Ga, and Zn, a target having a composition ratio of In:Ga:Zn=1:1:1 [in an atomic ratio] or a target having a composition ratio of In:Ga:Zn=1:1:2 [in an atomic ratio] can alternatively be used.

Examples of the sputtering method include an RF sputtering method using a high-frequency power source as a sputtering power source, a DC sputtering method using a DC power source as a sputtering power source, and a pulsed DC sputtering method in which a bias is applied in a pulsed manner. The RF sputtering method is mainly used in the case of forming an insulating film, and the DC sputtering method is mainly used in the case of forming a metal film.

Further, there is a sputtering method using a multi-source sputtering apparatus in which a plurality of targets of different materials can be set. With the multi-source sputtering apparatus, films of different materials can be deposited to be stacked in the same chamber, and plural kinds of materials can be deposited by electric discharge at the same time in the same chamber.

In addition, there are a magnetron sputtering method using a sputtering apparatus provided with a magnet system inside the chamber, and an ECR sputtering method using plasma generated with the use of microwaves without using glow discharge.

Further, as other examples of the sputtering method, there are also a reactive sputtering method in which a target substance and a sputtering gas component are chemically reacted with each other during film formation to deposit a thin compound film thereof, and a bias sputtering method in which a voltage is also applied to a substrate during film formation.

Next, a resist mask is formed over the oxide semiconductor film 430 by a second photolithography process, and then, the oxide semiconductor film 430 is etched using the resist mask, so that the oxide semiconductor film 430 is processed into an island-shaped oxide semiconductor layer. After that, the resist mask is removed.

Figure 8A:
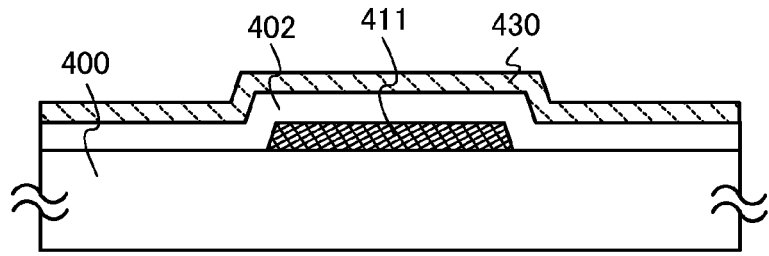
FIGS. 8A to 8D illustrate a transistor in Embodiment 3.
Figure 8B:
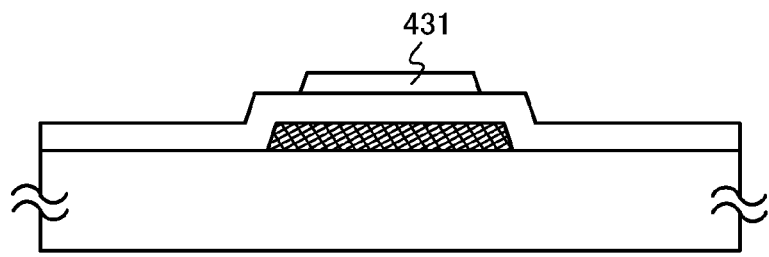
Figure 8C:
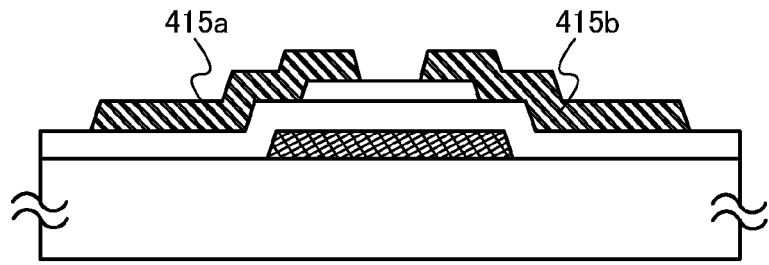
Figure 8D:
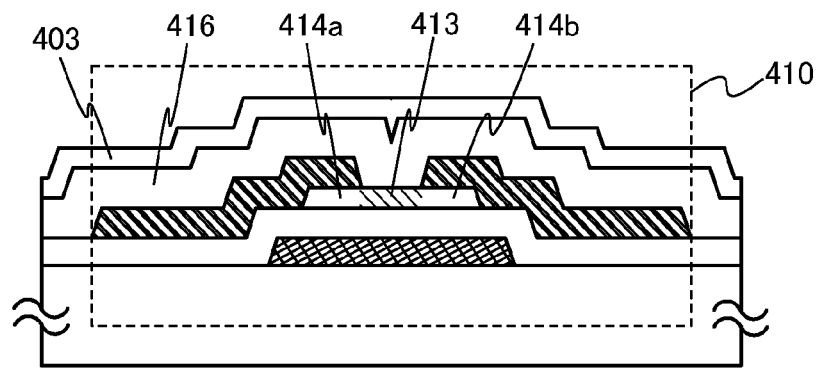

Next, dehydration or dehydrogenation of the oxide semiconductor layer is performed. The dehydration or dehydrogenation is carried out by conducting a first heat treatment and a second heat treatment. The temperature of the first heat treatment is higher than or equal to 400° C. and lower than or equal to 750° C., preferably higher than or equal to 400° C. and lower than the strain point of the substrate. In this embodiment, the substrate is introduced into an electric furnace which is one of heat treatment apparatuses, and heat treatment is performed on the oxide semiconductor layer in a nitrogen atmosphere at 450° C. for one hour. Then, the oxide semiconductor layer is cooled without exposure to the air in order to prevent entry of water and hydrogen into the oxide semiconductor layer, whereby an oxide semiconductor layer 431 is obtained (FIG. 8B).

The heat treatment apparatus is not limited to an electric furnace, and may be provided with a device for heating an object by heat conduction or thermal radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with the object by heat treatment, like nitrogen or a rare gas such as argon is used.

For example, as the first heat treatment, GRTA may be performed in which the substrate is transferred into a chamber filled with an inert gas heated to a high temperature as high as 650° C. to 700° C., heated for several minutes, and taken out from the inert gas. With GRTA, high-temperature heat treatment for a short period of time can be achieved.

It is preferable that in the first heat treatment, water, hydrogen, or the like be not contained in nitrogen or the rare gas such as helium, neon, or argon. Alternatively, the purity of nitrogen or the rare gas such as helium, neon, or argon introduced in the heat treatment apparatus is preferably 6N (99.9999%) or higher, far preferably 7N (99.99999%) or higher (that is, the concentration of impurities is preferably 1 ppm or less, far preferably 0.1 ppm or less).

The first heat treatment may be performed on the oxide semiconductor film 430 before being processed into the island-shaped oxide semiconductor layer. In that case, after the first heat treatment, the substrate is extracted from the heat treatment apparatus, and then the second photolithography process is performed.

The first heat treatment for dehydration or dehydrogenation of the oxide semiconductor layer may be performed at any of the following timings: after the oxide semiconductor layer is formed; and after a source electrode layer and a drain electrode layer are formed over the oxide semiconductor layer.

In the case where an opening is formed in the gate insulating layer 402, the opening may be formed in the gate insulating layer 402 before or after the dehydration or dehydrogenation of the oxide semiconductor film 430

The etching of the oxide semiconductor film 430 in this embodiment is not limited to wet etching; dry etching may be employed.

As an etching gas for the dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used as the etching gas for the dry etching.

As the dry etching method, a parallel plate RIE (reactive ion etching) method or an ICP (inductively coupled plasma) etching method can be used. In order to etch into an appropriate shape, etching conditions (electric power applied to an electrode coil, electric power applied to an electrode on a substrate side, the temperature of the electrode on the substrate side, or the like) are adjusted as appropriate.

As an etchant used for the wet etching, a mixed solution of phosphoric acid, acetic acid, and nitric acid, or the like can be used. ITO07N (produced by KANTO CHEMICAL CO., INC.) may be used as well.

The etchant after the wet etching is removed together with the etched material by cleaning. The waste liquid including the etchant and the etched material may be purified and any material contained in the etched material may be reused. For example, indium contained in the oxide semiconductor layer is collected from the waste liquid after the etching and recycled, so that resources can be effectively used and cost can be reduced.

Also in the wet etching, in order to etch into an appropriate shape, etching conditions (an etchant, etching time, temperature, and the like) are adjusted as appropriate depending on the material.

Next, a metal conductive film is formed over the gate insulating layer 402 and the oxide semiconductor layer 431. For example, a metal conductive film may be formed by a sputtering method or a vapor deposition method. As a material of the metal conductive film, it is possible to use an element selected from aluminum (Al), chromium (Cr), copper (Cu), tantalum (Ta), titanium (Ti), molybdenum (Mo), and tungsten (W), an alloy containing any of the elements as a component, an alloy combining the elements, or the like. Alternatively, one or more materials selected from manganese (Mn), magnesium (Mg), zirconium (Zr), beryllium (Be), and yttrium (Y) may be used. Further, the metal conductive film may have a single-layer structure or a stacked-layer structure of two or more layers. For example, as examples of the metal conductive film, the following can be given: a single layer of an aluminum film containing silicon; a single layer of a copper film or a film containing copper as a main component; a stacked layer in which a titanium film is stacked on an aluminum film; a stacked layer in which a copper film is stacked on a tantalum nitride film or a copper nitride film; a stacked layer in which an aluminum film is stacked on a titanium film, and a titanium film is stacked on the aluminum film; and the like. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In the case where the first heat treatment is performed after formation of the metal conductive film, it is preferable that the metal conductive film have heat resistance enough to withstand the first heat treatment.

Next, a resist mask is formed over the metal conducive film by a third photolithography process, and then, the metal conducive film is etched using the resist mask, so that a source electrode layer 415*a* and a drain electrode layer 415*b* are formed. After that, the resist mask is removed (see FIG. 8C).

Materials and etching conditions are adjusted as appropriate so that the oxide semiconductor layer 431 is not removed by the etching of the metal conductive film.

In this embodiment, a titanium film is used as the metal conductive film, an In—Ga—Zn—O-based oxide semiconductor layer is used as the oxide semiconductor layer 431, and an ammonia hydrogen peroxide solution (a mixture of ammonia, water, and a hydrogen peroxide solution) is used as an etchant of the titanium film.

The third photolithography process may also etch part of the oxide semiconductor layer 431 so that a groove (a depressed portion) is formed in the oxide semiconductor layer. The resist mask used in this step may be formed by an inkjet method. Formation of the resist mask by an inkjet method needs no photomask; thus, manufacturing cost can be reduced.

In order to reduce the number of photomasks and the number of steps in the photolithography process, the etching may be performed with the use of a resist mask formed using a multi-tone mask which is a photomask through which light is transmitted to have a plurality of intensities. Since the resist mask formed using a multi-tone mask has a plurality of thicknesses and can be further changed in shape by ashing, the resist mask can be used in a plurality of etching steps to form different patterns. Therefore, a resist mask corresponding to at least two kinds of different patterns can be formed by one multi-tone mask. Thus, the number of photomasks can be reduced, which leads to simplification of the manufacturing process.

Next, plasma treatment using a gas of nitrous oxide ($N_2O$), nitrogen ($N_2$), or argon (Ar) is performed. By this plasma treatment, adsorbed water and the like attached to an exposed surface of the oxide semiconductor layer are removed. Plasma treatment may be performed using a mixture gas of oxygen and argon as well.

An oxide insulating layer 416 which serves as a protective insulating film and is in contact with part of the oxide semiconductor layer is next formed without exposure to the air after the plasma treatment.

The oxide insulating layer 416 can be formed to a thickness of at least 1 nm by a method with which impurities such as water or hydrogen do not enter the oxide insulating layer 416, such as a sputtering method, as appropriate. Hydrogen contained in the oxide insulating layer 416 enters the oxide semiconductor layer, which makes the resistance of the backchannel of the oxide semiconductor layer 431 low (makes the backchannel have an n-type conductivity) to form a parasitic channel. Therefore, it is important that a formation method in which hydrogen is not used is employed in order to form the oxide insulating layer 416 containing as little hydrogen as possible.

In this embodiment, a 200-nm-thick silicon oxide film is formed as the oxide insulating layer 416 by a sputtering method. The substrate temperature in the film formation may be higher than or equal to room temperature and lower than or equal to 300° C. and is 100° C. in this embodiment. The formation of a silicon oxide film by a sputtering method can be performed in a rare gas (typically, argon) atmosphere, an oxygen atmosphere, or an atmosphere of a rare gas (typically, argon) and oxygen. A silicon oxide target or a silicon target can be used as a target. For example, the silicon oxide film can be formed using a silicon target by a sputtering method in an atmosphere containing oxygen and nitrogen.

Next, a second heat treatment (preferably at a temperature higher than or equal to 200° C. and lower than or equal to 400° C., e.g., at a temperature higher than or equal to 250° C. and lower than or equal to 350° C.) is performed in an inert gas atmosphere or an oxygen gas atmosphere. For example, the second heat treatment is performed in a nitrogen atmosphere at 250° C. for one hour. Through the second heat treatment, part of the oxide semiconductor layer (a channel formation region) is heated while being in contact with the oxide insulating layer 416. Accordingly, oxygen is supplied to the part of the oxide semiconductor layer 431 (the channel formation region).

As described above, the oxide semiconductor layer is subjected to the second heat treatment for dehydration or dehydrogenation by which the part of the oxide semiconductor layer (channel formation region) is selectively made in an oxygen-excess state. Consequently, a channel formation region 413 which overlaps with the gate electrode layer 411 becomes an i-type, and a low-resistance region 414a whose electrical resistance is lower than that of the channel formation region 413 and which overlaps with the source electrode layer 415a and a low-resistance region 414b whose electrical resistance is lower than that of the channel formation region 413 and which overlaps with the drain electrode layer 415b are formed in a self-aligned manner. Through the above-described process, a transistor 410 is formed.

For example, with a gate bias-temperature stress test (BT test) at 85° C. with $2 \times 10^6$ V/cm for 12 hours, an impurity contained in an oxide semiconductor layer causes the following phenomenon: a bond between the impurity and a main component of the oxide semiconductor layer is cleaved by a high electrical field (B: bias) and high temperature (T: temperature), and a generated dangling bond causes drift of the threshold voltage (Vth). On the other hand, in the case where impurities in an oxide semiconductor layer, particularly hydrogen or water, are removed as much as possible and a high-quality gate insulating layer which is dense and has high dielectric strength voltage is formed using the above-described high-density plasma CVD apparatus to provide high interface properties between the gate insulating layer and the oxide semiconductor layer, a transistor which is stable even under the BT test can be provided.

Heat treatment may be further performed, after the second heat treatment, at a temperature higher than or equal to 100° C. and lower than or equal to 200° C. for a period longer than or equal to 1 hour and shorter than or equal to 30 hours in the air. In this embodiment, the heat treatment is performed at 150° C. for 10 hours. This heat treatment may be performed at a fixed temperature. Alternatively, the following change in the heating temperature may be repeated plural times: the heating temperature is increased from room temperature to a temperature higher than or equal to 100° C. and lower than or equal to 200° C. and then decreased to room temperature. This heat treatment may be performed under a reduced pressure. Under the reduced pressure, the heat treatment time can be shortened.

The formation of the low-resistance region 414b in the oxide semiconductor layer so as to overlap with the drain electrode layer 415b can improve the reliability of the transistor. Specifically, by the formation of the low-resistance region 414b, a structure can be obtained in which the conductivity of the transistor can be varied gradually from the drain electrode layer 415b to the channel formation region 413 through the low-resistance drain region 414b.

In the case where the thickness of the oxide semiconductor layer is as small as less than or equal to 15 nm, the low-resistance region in the oxide semiconductor layer is formed wholly in the thickness direction; in the case where the thickness of the oxide semiconductor layer is as large as greater than or equal to 30 nm and less than or equal to 50 nm, part of the oxide semiconductor layer, which is in contact with the source or drain electrode layer and in a peripheral thereof is made to be the low-resistance region in which the resistance is lower, and part of the oxide semiconductor layer, which is close to the gate insulating layer can be made to be an i-type.

A protective insulating layer may be formed over the oxide insulating layer 416. For example, a silicon nitride film is formed by an RF sputtering method. The RF sputtering method, which achieves high mass productivity, is preferable as a formation method of the protective insulating layer. The protective insulating layer is a layer in which impurities such as moisture, a hydrogen ion, or an OW ion are not contained or contained as little as possible. An inorganic insulating film which blocks entry of them can be formed as the protective insulating layer. As the inorganic insulating film, a silicon nitride film, an aluminum nitride film, a silicon nitride oxide film, an aluminum oxynitride film, or the like can be used. In this embodiment, a silicon nitride film is formed as a protective insulating layer 403 (see FIG. 8D).

In this manner, the transistor included in the liquid crystal display device of the above embodiment can be manufactured. One embodiment of the present invention is not limited to the transistor; a multi-gate transistor having a plurality of channel formation regions can be used as the transistor included in the liquid crystal display device of the above embodiment, as appropriate. A top-gate transistor can be used as the transistor included in the liquid crystal display device of the above embodiment, as well. A channel-etched transistor, a channel-stop transistor, a bottom-contact transistor, or the like can also be used as the transistor included in the liquid crystal display device of the above embodiment.

This embodiment can be combined with or replaced by any of other embodiments as appropriate.

(Embodiment 4)

In Embodiment 4, an external appearance and a cross section of an example of the liquid crystal display device described in the above embodiment will be described using FIGS. 9A to 9C. FIGS. 9A to 9C illustrate examples of the liquid crystal display device of this embodiment: FIGS. 9A and 9C are plan views and FIG. 9B is a cross-sectional view along line M-N in FIG. 9A or 9C.

In the liquid crystal display device shown in FIGS. 9A to 9C, a sealant 4005 is provided so as to surround a pixel portion 4002 and a scan line driver circuit 4004 which are provided over a first substrate 4001. In addition, a second substrate 4006 is provided over the pixel portion 4002 and the scan line driver circuit 4004. Thus, the pixel portion 4002 and the scan line driver circuit 4004 in addition to a liquid crystal layer 4008 are sealed between the first substrate 4001 and the second substrate 4006 with the sealant 4005. Further, in the liquid crystal display device shown in FIGS. 9A to 9C, a signal line driver circuit 4003 which is formed using a single crystal semiconductor film or a polycrystalline semiconductor film over another substrate is mounted in a region that is different from the region surrounded by the sealant 4005 over the first substrate 4001.

There is no particular limitation on the connection method of a driver circuit which is separately formed; a COG method, a wire bonding method, a TAB method, or the like can be used. FIG. 9A illustrates an example in which the signal line driver circuit 4003 is mounted by a COG method, and FIG. 9C illustrates an example in which the signal line driver circuit 4003 is mounted by a TAB method.

Each of the pixel portion 4002 and the scan line driver circuit 4004 which are provided over the first substrate 4001 includes a plurality of transistors. In FIG. 9B, a transistor 4010 included in the pixel portion 4002 and a transistor 4011 included in the scan line driver circuit 4004 are illustrated as an example. Insulating layers 4041, 4042, and 4021 are provided over the transistors 4010 and 4011.

As any of the transistors 4010 and 4011, a transistor including an oxide semiconductor layer functioning as a channel formation layer can be used like the liquid crystal display device of the above embodiment; for example, the transistor described in Embodiment 3 can be used.

The transistor 4010 includes a gate electrode layer 4051, a gate insulating layer 4020 provided over the gate electrode layer 4051, an oxide semiconductor layer 4052 provided over the gate electrode layer 4051 with the gate insulating layer 4020 provided therebetween, and a source electrode layer 4053 and a drain electrode layer 4054 provided over the oxide semiconductor layer 4052.

The transistor 4011 includes a gate electrode layer 4061, the gate insulating layer 4020 provided over the gate electrode layer 4061, an oxide semiconductor layer 4062 provided over the gate electrode layer 4061 with the gate insulating layer 4020 provided therebetween, and a source electrode layer 4063 and a drain electrode layer 4064 provided over the oxide semiconductor layer 4062.

A conductive layer 4040 is provided over the insulating layer 4021 so as to overlap with a channel formation region of the oxide semiconductor layer 4062 in the transistor 4011. The provision of the conductive layer 4040 so as to overlap with the channel formation region of the oxide semiconductor layer 4062 can reduce the amount of shift in the threshold voltage of the transistor 4011 by external stress. The conductive layer 4040 may have the same voltage as or have voltage different from that of the gate electrode layer 4061 of the transistor 4011 and can function as a second gat electrode layer. The voltage of the conductive layer 4040 may be GND or OV, or the conductive layer 4040 may be in a floating state. The conductive layer 4040 is not necessarily provided.

A pixel electrode layer 4030 is provided so as to be electrically connected to the source electrode layer 4053 or the drain electrode layer 4054 of the transistor 4010 through an opening in the insulating layers 4041, 4042, and 4021. A counter electrode layer 4031 is provided to the second substrate 4006. A portion where the pixel electrode layer 4030, the counter electrode layer 4031, and the liquid crystal layer 4008 overlap with one another corresponds to a liquid crystal element 4013. The pixel electrode layer 4030 and the counter electrode layer 4031 are provided with an insulating layer 4032 and an insulating layer 4033 serving as alignment films, respectively, and the liquid crystal layer 4008 is sandwiched between the pixel electrode layer 4030 and the counter electrode layer 4031 with the insulating layers 4032 and 4033 provided therebetween.

A light-transmitting substrate can be used as any of the first substrate 4001 and the second substrate 4006; glass, ceramics, or plastics can be used. As the plastics, a fiberglass-reinforced plastics (FRP) plate, a poly(vinyl fluoride) (PVF) film, a polyester film, or an acrylic resin film can be used.

A spacer 4035 is provided between the insulating layers 4032 and 4033. The spacer 4035 is a columnar partition wall obtained by selective etching of an insulating film, and is provided in order to control the distance (cell gap) between the pixel electrode layer 4030 and the counter electrode layer 4031. A spherical spacer may be used as the spacer 4035.

The counter electrode layer 4031 is electrically connected to a common voltage line provided over the same substrate as the transistor 4010. With the use of a connection portion with the common voltage line (also referred to as a common connection portion), the counter electrode layer 4031 can be electrically connected to the common voltage line via conductive particles arranged between the pair of substrates.

The sealant 4005 contains conductive particles.

In the liquid crystal display device of this embodiment, a liquid crystal showing a blue phase for which an alignment film is not needed may be used as a liquid crystal material of the liquid crystal layer 4008. The blue phase is one of the liquid crystal phases, which appears just before a cholesteric phase changes into an isotropic phase while temperature of cholesteric liquid crystal is increased. Since the blue phase appears only within a narrow range of temperatures, a liquid crystal composition containing a chiral agent at greater than or equal to 5 wt % is used for the liquid crystal layer 4008 in order to widen the temperature range. The liquid crystal composition which includes a liquid crystal showing a blue phase and a chiral agent has a short response time of 1 msec or less and has optical isotropy, which makes the alignment process unnecessary, and the viewing-angle dependence is small. In addition, since an alignment film does not need to be provided and rubbing treatment is also unnecessary, electrostatic discharge damage caused by the rubbing treatment can be prevented and defects and damage of the liquid crystal display device in the manufacturing process can be reduced. Thus, productivity of the liquid crystal display device can be increased. A transistor including an oxide semiconductor layer particularly has a possibility that electric characteristics of the transistor may fluctuate significantly by the static electricity and deviate from the design range. Therefore, it is more effective to use a liquid crystal material showing a blue phase for the liquid crystal display device including a transistor including an oxide semiconductor layer.

In the liquid crystal display device of this embodiment, a polarizing plate may be provided on the outer side of the substrate (on the viewer side) and a coloring layer and an electrode layer used in a display element may be sequentially provided on the inner side of the substrate; alternatively, the polarizing plate may be provided on the inner side of the substrate. The stacked-layer structure of the polarizing plate and the coloring layer may be set as appropriate in accordance with materials of the polarizing plate and the coloring layer and the condition of the manufacturing process. Further, a light-blocking layer serving as a black matrix may be provided in a portion other than the display portion.

The insulating layer 4041 is in contact with parts of the oxide semiconductor layers 4052 and 4062. A silicon oxide layer can be used as the insulating layer 4041, for example.

The insulating layer 4042 is provided on and in contact with the insulating layer 4041. A silicon nitride layer can be used as the insulating layer 4042, for example.

The insulating layer 4021 is provided over the insulating layer 4042. The insulating layer 4021 functions as a planarization insulating layer for reducing roughness of a surface of the transistor. An organic material having heat resistance, such as a polyimide, an acrylic resin, a benzocyclobutene-based resin, a polyamide, or an epoxy resin can be used for the insulating layer 4021. Other than such organic materials, it is also possible to use a low-dielectric constant material (a low-k material), a siloxane-based resin, PSG (phosphosilicate glass), BPSG (borophosphosilicate glass), or the like. The insulating layer 4021 may be formed by stacking a plurality of insulating films formed of these materials.

There is no particular limitation on the formation method of the insulating layer 4021. Depending on the material, the following method can be used: a sputtering method, an SOG method, a spin coating method, a dipping method, a spray coating method, or a droplet discharge method (e.g., an inkjet method, a screen printing method, or an offset printing method) e.

The pixel electrode layer 4030 and the counter electrode layer 4031 can be formed using a light-transmitting conductive material such as indium tin oxide (ITO), indium zinc oxide (IZO) in which zinc oxide (ZnO) is mixed in indium oxide, a conductive material in which silicon oxide ($SiO_2$) is mixed in indium oxide, indium oxide, tin oxide, indium oxide containing tungsten oxide, indium zinc oxide containing tungsten oxide, indium oxide containing titanium oxide, indium tin oxide containing titanium oxide, or the like. In the case where a light-transmitting property is not needed in a reflective liquid crystal display device, one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and nitrides of these metals can be used.

A conductive composition containing a conductive high molecule (also referred to as a conductive polymer) can be used for the pixel electrode layer 4030 and the counter electrode layer 4031. The electrode layer formed using the conductive composition has preferably a sheet resistance of less than or equal to 10000 Ω/square and a transmittance of 70% or more at a wavelength of 550 nm. Furthermore, the resistivity of the conductive high molecule contained in the conductive composition is preferably 0.1Ω·cm or less.

As the conductive high molecule, a so-called π-electron conjugated conductive polymer can be used. Examples thereof are polyaniline or a derivative thereof, polypyrrole or a derivative thereof, polythiophene or a derivative thereof, and a copolymer of two or more kinds of monomers of these materials.

Further, a variety of signals and voltages are supplied to the signal line driver circuit 4003 which is separately formed, the scan line driver circuit 4004, or the pixel portion 4002 from an FPC 4018. The FPC 4018 is electrically connected to a terminal electrode 4016 through a connection terminal electrode 4015 and an anisotropic conductive film 4019.

The connection terminal electrode 4015 is formed using the same conductive film as the pixel electrode layer 4030 of the liquid crystal element 4013, and the terminal electrode 4016 is formed using the same conductive film as the source electrode layer 4053 or the drain electrode layer 4054 of the transistor 4010.

Although FIGS. 9A to 9C illustrate an example in which the signal line driver circuit 4003 is formed separately and mounted on the first substrate 4001; however, one embodiment of the present invention is not limited to this structure. The scan line driver circuit may be separately formed and then mounted, or only part of the signal line driver circuit or part of the scan line driver circuit may be separately formed and then mounted.

Further, a black matrix (a light-shielding layer); an optical member (an optical substrate) such as a polarizing member, a retardation member, or an anti-reflection member; or the like can be provided as appropriate for the liquid crystal display device shown in any of FIGS. 9A to 9C. For example, circular polarization may be obtained by using a polarizing substrate and a retardation substrate as the optical member. In addition, a backlight, a side light, or the like may be used as a light source.

In an active matrix liquid crystal display device, display patterns are formed on a screen by driving pixel electrode layers arranged in a matrix. Specifically, voltage is applied between a selected pixel electrode layer and a counter electrode layer corresponding to the pixel electrode layer, and thus, a liquid crystal layer disposed between the pixel electrode layer and the counter electrode layer is optically modulated. This optical modulation is recognized as a display pattern by a viewer.

Further alternatively, in order to improve the moving-image characteristics of a liquid crystal display device, a driving technique may be employed in which a plurality of LED (light-emitting diode) light sources or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving technique, part of LEDs can be turned off, so that especially in the case of displaying an image in which the proportion of a black image area in one screen is high, power consumption can be reduced.

By combining such a driving technique, the display characteristics of the liquid crystal display device described in the above embodiment can be improved.

Since the transistor is easily broken due to static electricity or the like, it is preferable that a protective circuit be provided over the same substrate as the pixel portion and the driver circuit portion. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits are provided so that the transistor in the pixel and the like are not broken when a surge voltage due to static electricity or the like is applied to a scan line, a signal line, or a capacitor bus line. Therefore, the protective circuit is formed so that charge is released to a common wiring when surge voltage is applied to the protective circuit. Further, the protective circuit includes a non-linear element arranged in parallel to the scan line. The non-linear element includes a two-terminal element such as a diode or a three-terminal element such as a transistor. For example, the non-linear element can be formed through the same process as the transistor in the pixel portion. For example, characteristics similar to those of a diode can be obtained by connecting a gate to a drain of the non-linear element.

As a display mode of the liquid crystal display device of the present invention, the following can be used: a twisted nematic (TN) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like.

There is no particular limitation on the liquid crystal of the liquid crystal display device of this embodiment; a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. Among these, the liquid crystal display device of this embodiment is preferably a normally-black liquid crystal panel, for example, a transmissive liquid crystal display device employing a vertical alignment (VA) mode. Some examples are given as the vertical alignment mode; for example, an MVA (multi-domain vertical alignment) mode, a PVA (patterned vertical alignment) mode, an ASV mode, or the like can be employed.

In this manner, by using a transistor including an oxide semiconductor layer functioning as a channel formation layer in the pixel portion of the liquid crystal display device of this embodiment, the display device can display a still image for a long period of time. Further, the driver circuit portion can stop operating during a period in which a still image is displayed, whereby power consumption can be reduced.

This embodiment can be combined with or replaced by any of other embodiments as appropriate.

(Embodiment 5)

In Embodiment 5, a liquid crystal display device added with a touch panel function will be described as an example of the liquid crystal display device described in the above embodiment.

Figure 10A:
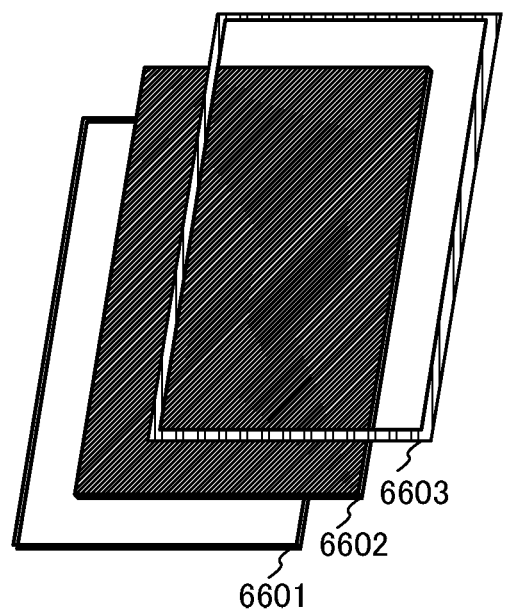
FIGS. 10A and 10B illustrate structure examples of a liquid crystal display device in Embodiment 5.
Figure 10B:
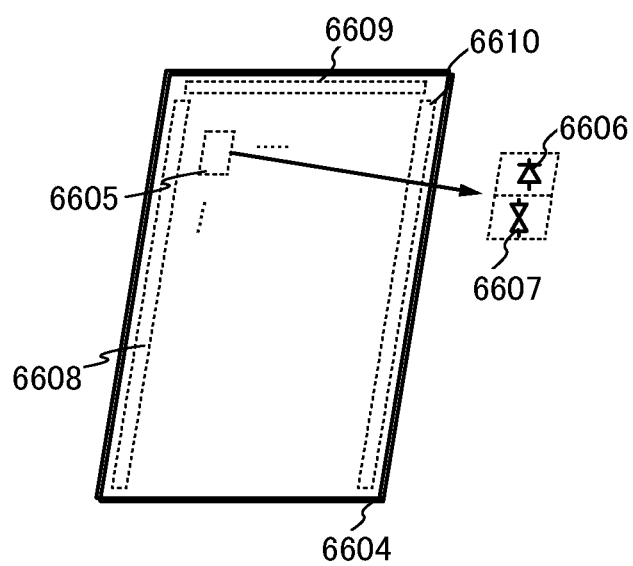

FIGS. 10A and 10B illustrate examples of a structure of the liquid crystal display device of this embodiment.

A liquid crystal display device shown in FIG. 10A includes a liquid crystal display unit 6601 and a touch panel unit 6602 which is provided so as to overlap with the liquid crystal display unit 6601. The liquid crystal display unit 6601 and the touch panel unit 6602 are attached to each other with a housing (case) 6603.

The liquid crystal display device described in the above embodiment can be applied as the liquid crystal display unit 6601.

As the touch panel unit 6602, a resistive touch panel, a surface capacitive touch panel, a projected capacitive touch panel, or the like can be used as appropriate.

As shown in FIG. 10A, one example of the liquid crystal display device of this embodiment has a structure in which a liquid crystal display unit and a touch panel unit which are separately manufactured overlap each other. With this structure, manufacturing cost of the liquid crystal display device added with a touch panel function can be reduced.

A liquid crystal display device 6604 shown in FIG. 10B includes a plurality of pixels 6605 in a display portion, and each pixel 6605 includes a photosensor 6606 and a liquid crystal element 6607. The liquid crystal display device 6604 shown in FIG. 10B reads data as follows: an object data of which is to be read (e.g., a finger or a pen) is moved to touch or be close to the photosensor 6606 in the pixel 6605, and photocurrent is generated with the photosensor 6606 in accordance with reflected light from the object. The liquid crystal display device 6604 shown in FIG. 10B does not, unlike the liquid crystal display device shown in FIG. 10A, involve an overlap of the touch panel unit 6602, so that the thickness of the liquid crystal display device can be reduced. Further, in addition to the pixel portion 6605, a scan line driver circuit 6608, a signal line driver circuit 6609, and a photosensor driver circuit 6610 can be formed over the same substrate as the pixel portion 6605, whereby the liquid crystal display device can be downsized. The photosensor 6606 may be formed using amorphous silicon or the like and overlapped with a transistor including an oxide semiconductor.

By using a transistor including an oxide semiconductor layer functioning as a channel formation layer in the liquid crystal display device added with a touch panel function of this embodiment, the display device can display a still image for a long period of time. Further, the driver circuit portion can stop operating during a period in which a still image is displayed, whereby power consumption can be reduced.

This embodiment can be combined with or replaced by any of other embodiments as appropriate.

(Embodiment 6)

In Embodiment 6, an electronic book reader will be described as an example of the liquid crystal display device described in the above embodiment.

Figure 11:
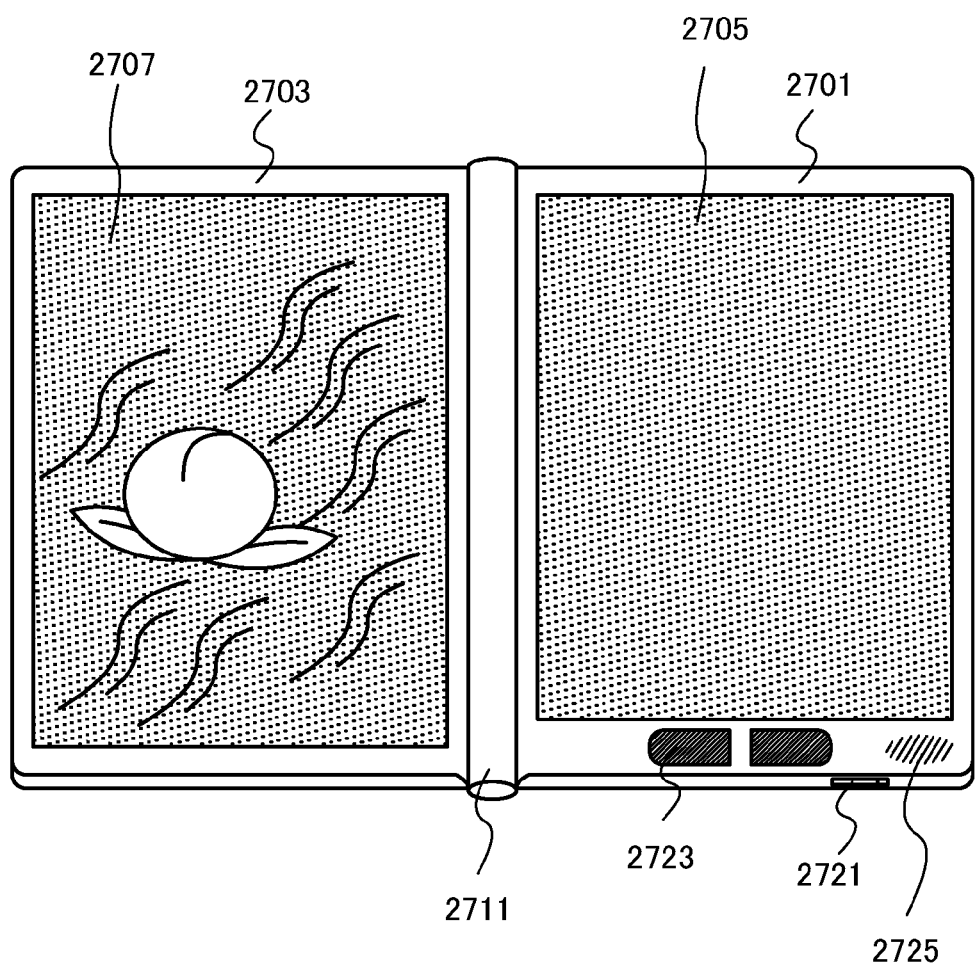
FIG. 11 illustrates a structure example of an e-book reader in Embodiment 6.

An electronic book reader of this embodiment is described below using FIG. 11. FIG. 11 illustrates an example of the electronic book reader of this embodiment.

The electronic book reader illustrated in FIG. 11 includes two housings, a housing 2701 and a housing 2703. The housings 2701 and 2703 are connected by a hinge portion 2711 and can be opened or closed with the hinge portion 2711. With such a structure, the electronic book reader can operate like a paper book.

A display portion 2705 and a display portion 2707 are incorporated in the housing 2701 and the housing 2703, respectively. The display portion 2705 and the display portion 2707 may display different images. One image may be displayed across both the display portions. In the case of displaying different images, for example, text can be displayed on a display portion on the right side (the display portion 2705 in FIG. 11) and graphics can be displayed on a display portion on the left side (the display portion 2707 in FIG. 11).

The example of the electronic book reader illustrated in FIG. 11 is provided with an operation portion and the like for the housing 2701. For example, the housing 2701 is provided with a power switch 2721, an operation key 2723, a speaker 2725, and the like. With the operation key 2723, pages can be turned. Further, a keyboard, a pointing device, or the like may also be provided on the same plane as the display portion of the housing. In addition, an external connection terminal (an earphone terminal, a USB terminal, a terminal connectable to a variety of cables such as an AC adapter and a USB cable, or the like), a recording medium insertion portion, and the like may be provided on the rear surface or the side surface of the housing. Further, a function of an electronic dictionary may be provided for the electronic book reader illustrated in FIG. 11.

The electronic book reader of this embodiment may transmit and receive data wirelessly. Through wireless communication, book data or the like can be purchased and downloaded from an electronic book server.

The electronic book reader of this embodiment may have a power supply circuit including a solar battery cell, a power storage device for charging voltage output from the solar battery cell, and a DC converter for converting a voltage charged in the power storage device into respective voltages for circuits. Accordingly, an external power supply is not needed, and thus the electronic book reader can be used for a long period of time even at a place with no power supply, so that convenience can be improved. As the power storage device, for example, one or more of a lithium ion secondary battery, a lithium ion capacitor, an electric double-layer capacitor, a redox capacitor, and the like can be used. For example, a lithium ion secondary battery and a lithium ion capacitor are used together, whereby a power storage device which can charge or discharge at high speed and can supply electric power for a long time can be formed. There is no limitation the power storage device on the lithium ion secondary battery. For the power storage device, a secondary battery in which another alkali metal ion, alkaline earth metal ion, or the like is used as a mobile ion may be used. There is no limitation also on the lithium ion capacitor. For the power storage device, a capacitor in which another alkali metal ion, alkaline earth metal ion, or the like is used as a mobile ion may be used.

By using a transistor including an oxide semiconductor layer functioning as a channel formation layer in the electronic book reader of this embodiment, the display device can display a still image for a long period of time, which is particularly effective for displaying a still image for a long period of time on an electronic book reader. Further, the driver circuit portion can stop operating during a period in which a still image is displayed, whereby power consumption can be reduced.

This embodiment can be combined with or replaced by any of other embodiments as appropriate.

(Embodiment 7)

In Embodiment 7, an electronic device which has the liquid crystal display device described in the above embodiment in a display portion will be described.

By applying the liquid crystal display device described in the above embodiment to display portions of a variety of electronic devices, a variety of functions in addition to a display function can be provided for the electronic devices. Specific examples of the electronic device in which the liquid crystal display device described in the above embodiment is applied to a display portion are described below using FIGS. 12A to 12F. FIGS. 12A to 12F each illustrate an example of a structure of an electronic device of this embodiment.

Figure 12A:
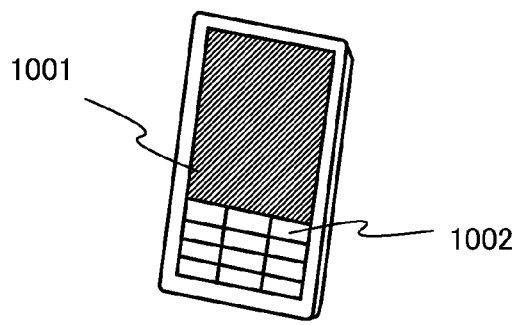
FIGS. 12A to 12F illustrate structure examples of electronic devices in Embodiment 7.

FIG. 12A illustrates a personal digital assistant. The personal digital assistant illustrated in FIG. 12A has at least a display portion 1001. The personal digital assistant illustrated in FIG. 12A can be combined with a touch panel or the like, and can be used as an alternative to a variety of his/her personal effects. For example, the display portion 1001 is provided with an operation portion 1002, so that the personal digital assistant can be used as a mobile phone. The operation portion 1002 is not necessarily provided for the display portion 1001; an operation buttons/operation bottoms may be provided anywhere for the personal digital assistant. Moreover, the personal digital assistant can be used as a notepad or used as a handy scanner by using a document input-output function. Further, the liquid crystal display device described in the above embodiment can realize long intervals between writing operations since a display period by one image-data writing is long. Therefore, by using the liquid crystal display device described in the above embodiment for the personal digital assistant illustrated in FIG. 12A, eyestrain can be suppressed even when images can be seen on the display portion for a long period of time, for example.

Figure 12D:
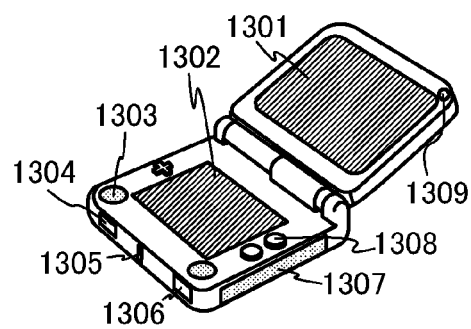
Figure 12B:
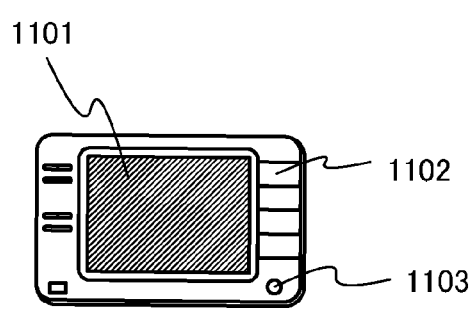

FIG. 12B illustrates an information guide terminal including an automotive navigation system, for example. The information guide terminal illustrated in FIG. 12B has at least a display portion 1101, and can also have operation buttons 1102, an external input terminal 1103, and the like. In-car temperatures change greatly in accordance with the outside-air temperature, and sometimes exceed 50° C. The liquid crystal display device described in the above embodiment, the characteristic change of which by the temperature is small, is particularly effective under circumstances where the temperature greatly changes such as the inside of a vehicle FIG. 12C illustrates a laptop personal computer. The laptop personal computer illustrated in FIG. 12C has a housing 1201, a display portion 1202, a speaker 1203, an LED lamp 1204, a pointing device 1205, a connection terminal 1206, and a keyboard 1207. The liquid crystal display device described in the above embodiment can realize long intervals between writing operations since a display period by one image-data writing is long. Therefore, by using the liquid crystal display device described in the above embodiment for the laptop personal computer illustrated in FIG. 12C, eyestrain can be suppressed even when images can be seen on the display portion for a long period of time, for example.

FIG. 12D illustrates a portable game machine. The portable game machine illustrated in FIG. 12D has a first display portion 1301, a second display portion 1302, a speaker 1303, a connection terminal 1304, an LED lamp 1305, a microphone 1306, a recording medium reading portion 1307, operation buttons 1308, and a sensor 1309. Further, the liquid crystal display device described in the above embodiment can realize long intervals between writing operations since a display period by one image-data writing is long. Therefore, by using the liquid crystal display device described in the above embodiment for the portable game machine illustrated in FIG. 12D, eyestrain can be suppressed even when images can be seen on the display portion for a long period of time, for example. Further, different images can be displayed on the first display portion 1301 and the second display portion 1302; for example, a moving image is displayed on one of them and a still image is displayed on the other. Accordingly, a signal or voltage supply to the driver circuit portion for the display portion where a still image is displayed can be stopped, whereby power consumption can be reduced.

Figure 12E:
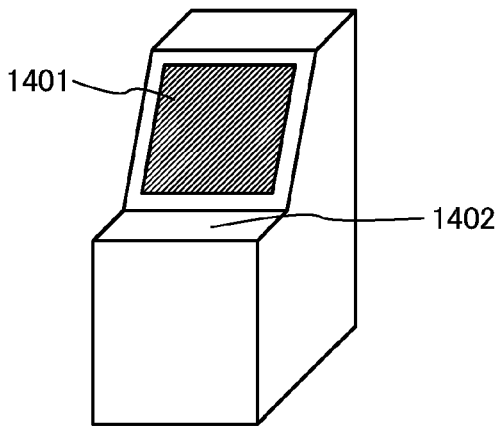
Figure 12C:
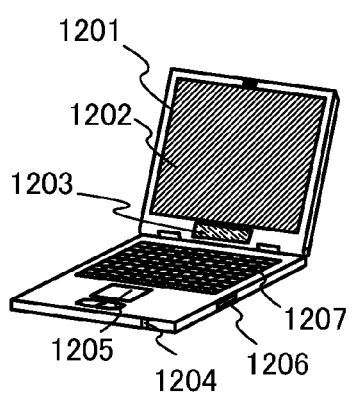

FIG. 12E illustrates a stationary information communication terminal. The stationary information communication terminal illustrated in FIG. 12E has at least a display portion 1401. The display portion 1401 can be provided on a plane portion 1402. Further, operation buttons or the like can be provided for the plane portion 1402. The stationary information communication terminal illustrated in FIG. 12E can be used as an automated teller machine or an information communication terminal (also referred to as a multimedia station) for ordering information goods such as a ticket (including a coupon). The liquid crystal display device described in the above embodiment can realize long intervals between writing operations since a display period by one image-data writing is long. Therefore, by using the liquid crystal display device described in the above embodiment for the stationary information communication terminal illustrated in FIG. 12E, eyestrain can be suppressed even when images can be seen on the display portion for a long period of time, for example.

Figure 12F:
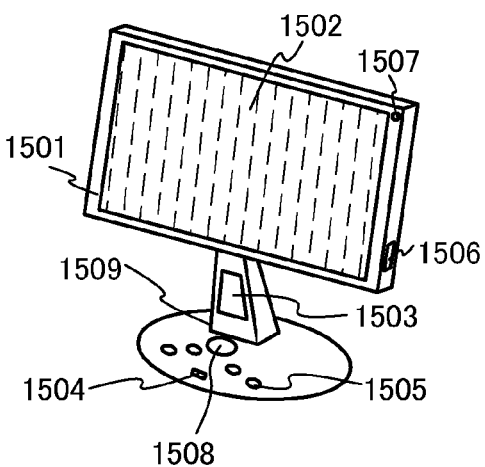

FIG. 12F illustrates a display. The display illustrated in FIG. 12F has a housing 1501, a display portion 1502, a speaker 1503, an LED lamp 1504, operation buttons 1505, a connection terminal 1506, a sensor 1507, a microphone 1508, and a support base 1509. The liquid crystal display device described in the above embodiment can realize long intervals between writing operations since a display period by one image-data writing is long. Therefore, by using the liquid crystal display device described in the above embodiment for the display illustrated in FIG. 12F, eyestrain can be suppressed even when images can be seen on the display portion for a long period of time, for example.

By applying the liquid crystal display device described in the above embodiment to display portions of electronic devices, multifunctional electronic devices can be provided.

This embodiment can be combined with any of other embodiments as appropriate.

This application is based on Japanese Patent Application serial No. 2009-288283 filed with Japan Patent Office on Dec. 18, 2009, the entire contents of which are hereby incorporated by reference.

What is claimed is:

1. A method for driving a liquid crystal display device, the liquid crystal display device comprising:
    a pixel portion comprising a plurality of pixels, one of the plurality of pixels comprising:
        a liquid crystal element comprising a first terminal and a second terminal;
        a capacitor comprising a first terminal and a second terminal;
        a transistor comprising:
            a gate electrically connected to a scan line;
            a first terminal electrically connected to a signal line; and
            a second terminal electrically connected to the first terminal of the liquid crystal element and the first terminal of the capacitor, wherein the transistor comprises an oxide semiconductor layer comprising a channel formation region, the method comprising:

supplying a potential of an image signal to the first terminal of the liquid crystal element and the first terminal of the capacitor in a first frame period;

stopping supply of the potential in second to n-th frame periods, wherein n is a natural number larger than 1;

inverting a polarity of a voltage that is applied to the liquid crystal element between the n-th frame period and a (n+1)-th frame period; and compensating the voltage so that an absolute value of the voltage in the n-th frame period is the same as an absolute value of the voltage in the (n+1)-th frame period.

2. The method according to claim 1, wherein the voltage is compensated by compensating a potential of the second terminal of the liquid crystal element or a potential of the second terminal of the capacitor.

3. The method according to claim 1, wherein the liquid crystal element comprises a liquid crystal layer between the first terminal of the liquid crystal element and the second terminal of the liquid crystal element.

4. The method according to claim 1, wherein the oxide semiconductor layer comprises indium, gallium, and zinc.

5. The method according to claim 1, wherein the voltage is compensated when the absolute value of the voltage in the n-th frame period is different from the absolute value of the voltage in the (n+1)-th frame period.

6. The method according to claim 1, wherein a still image is formed in the first to (n+1)-th frame periods.

7. The method according to claim 1, wherein a frame frequency is lowered to one-tenth during compensating the voltage.

8. A liquid crystal display device comprising:

a pixel portion comprising a plurality of pixels, one of the plurality of pixels comprising:
- a liquid crystal element comprising a first terminal and a second terminal;
- a capacitor comprising a first terminal and a second terminal;
- a transistor comprising:
  - a gate electrically connected to a scan line;
  - a first terminal electrically connected to a signal line; and
  - a second terminal electrically connected to the first terminal of the liquid crystal element and the first terminal of the capacitor;

a driver circuit electrically connected to the pixel portion;
a display control circuit; and
a compensation circuit, wherein the transistor comprises an oxide semiconductor layer comprising a channel formation region, wherein the display control circuit is capable of:
supplying a potential of an image signal to the driver circuit in a first frame period; and
stopping supply of the potential in second to n-th frame periods, wherein n is a natural number larger than 1;

wherein the driver circuit is capable of supplying a potential to invert a polarity of a voltage that is applied to the liquid crystal element between the n-th frame period and a (n+1)-th frame period; and wherein the compensation circuit is capable of compensating the voltage so that an absolute value of the voltage in the n-th frame period is the same as an absolute value of the voltage in the (n+1)-th frame period.

9. The liquid crystal display device according to claim 8, further comprising a memory circuit, wherein the memory circuit is capable of storing data of the first to n-th frame periods.

10. The liquid crystal display device according to claim 8, further comprising a comparison circuit,
wherein the comparison circuit is capable of comparing data of a m-th frame period with data of a (m+1)-th frame period,
wherein m is a natural number smaller than n, and
wherein the comparison circuit is capable of judging whether the data of the m-th frame period is the same as the data of the (m+1)-th frame period.

11. The liquid crystal display device according to claim 10, further comprising a selection circuit, wherein the selection circuit is capable of stopping supply of the image signal of the (m+1)-th frame period to the display control circuit when the comparison circuit judges the data of the (m+1)-th frame period as being the same as the data of the m-th frame period.

12. The liquid crystal display device according to claim 8, further comprising a counting circuit, wherein the counting circuit is capable of counting number of continuous frame periods that are judged as having the same data as the data of the image signal.

13. The liquid crystal display device according to claim 8, wherein the oxide semiconductor layer comprises indium, gallium, and zinc.

14. The liquid crystal display device according to claim 8, wherein the compensation circuit is capable of compensating the data when the absolute value of the data in the n-th frame period is different from the absolute value of the voltage in the (n+1)-th frame period.

15. The liquid crystal display device according to claim 8, wherein a still image is formed in the first to (n+1)-th frame periods.

* * * * *